(12) United States Patent
Moon et al.

(10) Patent No.: US 10,777,114 B2
(45) Date of Patent: Sep. 15, 2020

(54) DISPLAY PANEL, DISPLAY DEVICE, AND OPERATION METHOD OF DISPLAY DEVICE

(71) Applicant: Samsung Electronics Co., Ltd., Suwon-si, Gyeonggi-do (KR)

(72) Inventors: Young-Bae Moon, Yongin-si (KR); Jeongpyo Kim, Seoul (KR); Kiho Kong, Suwon-si (KR); Jeehwal Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/869,835

(22) Filed: Jan. 12, 2018

(65) Prior Publication Data

US 2018/0330654 A1 Nov. 15, 2018

(30) Foreign Application Priority Data

Apr. 11, 2017 (KR) .................. 10-2017-0046853
Jun. 26, 2017 (KR) .................. 10-2017-0080528

(51) Int. Cl.
*G09G 3/20* (2006.01)
*G09G 3/3266* (2016.01)
(Continued)

(52) U.S. Cl.
CPC ......... *G09G 3/2003* (2013.01); *G09G 3/3258* (2013.01); *G09G 3/3266* (2013.01); *G09G 3/3275* (2013.01); *H01L 27/3276* (2013.01); *G09G 2300/0452* (2013.01); *G09G 2310/0213* (2013.01); *G09G 2310/0235* (2013.01); *G09G 2310/0251* (2013.01); *G09G 2310/0291* (2013.01); *G09G 2310/0297* (2013.01); *G09G 2330/021* (2013.01); *G09G 2330/023* (2013.01);
(Continued)

(58) Field of Classification Search
CPC .. G09G 3/2003; G09G 3/3266; G09G 3/3258; H01L 27/3218
See application file for complete search history.

(56) References Cited

U.S. PATENT DOCUMENTS 7,880,716 B2   2/2011   Tanaka et al.
8,477,127 B2   7/2013   Tanaka et al.
(Continued)

FOREIGN PATENT DOCUMENTS

KR   2016-0033289 A   3/2016
KR   2016-0086504 A   7/2016

*Primary Examiner* — Shaheda A Abdin
(74) *Attorney, Agent, or Firm* — Harness, Dickey & Pierce, P.L.C.

(57) ABSTRACT

In one embodiment, the control integrated circuit includes a gate driver configured to selectively drive a plurality of gate lines associated with pixels in a display panel; a source driver configured to supply data to the display panel; and a controller configured to generate switch control signals for controlling a switch driver of the display panel, the switch driver for selectively supplying the data to a plurality of data lines. The controller is configured to control the gate driver and generate the switch control signals such that the plurality of gate lines are activated non-sequentially, and an order of pixels activated and associated with a same one of the plurality of data lines includes at least two pixels of a same color activated in sequence.

18 Claims, 22 Drawing Sheets

(51) Int. Cl.
*G09G 3/3275* (2016.01)
*G09G 3/3258* (2016.01)
*H01L 27/32* (2006.01)

(52) U.S. Cl.
CPC ........ *H01L 27/323* (2013.01); *H01L 27/3216* (2013.01); *H01L 27/3218* (2013.01)

(56) References Cited

U.S. PATENT DOCUMENTS

| | | | |
|---|---|---|---|
| 2008/0180463 A1* | 7/2008 | Ogura | G09G 3/325 345/690 |
| 2009/0244041 A1 | 10/2009 | Choe | |
| 2010/0141693 A1* | 6/2010 | Lee | G09G 3/3216 345/694 |
| 2012/0006978 A1* | 1/2012 | Ludwig | G06F 3/0412 250/214.1 |
| 2015/0161927 A1 | 6/2015 | Hekstra | |
| 2015/0311265 A1* | 10/2015 | Matsueda | H01L 27/3218 257/40 |
| 2015/0379947 A1 | 12/2015 | Sang et al. | |
| 2016/0078826 A1* | 3/2016 | Yoo | G09G 3/3648 345/691 |
| 2016/0203776 A1 | 7/2016 | Choo et al. | |
| 2016/0267868 A1 | 9/2016 | Choi | |
| 2016/0321977 A1* | 11/2016 | Kong | G09G 3/2003 |

* cited by examiner

DISPLAY PANEL, DISPLAY DEVICE, AND OPERATION METHOD OF DISPLAY DEVICE

CROSS-REFERENCE TO RELATED APPLICATIONS

A claim for priority under 35 U.S.C. § 119 is made to Korean Patent Application No. 10-2017-0046853 filed on Apr. 11, 2017 and Korean Patent Application No. 10-2017-0080528, filed on Jun. 26, 2017, in the Korean Intellectual Property Office, the entire contents of each of which are hereby incorporated by reference.

BACKGROUND

Embodiments of the inventive concepts disclosed herein relate to a display device, and more particularly, to a display panel, a display device and/or an operating method of the display device.

A display device includes gate lines, data lines, and a plurality of pixels. The pixels are connected with the gate lines and the data lines. The display device includes a gate driving circuit to control the gate lines and a data driving circuit to control the data lines. The gate driving circuit provides a gate signal to each of the gate lines, and the data driving circuit provides a data signal to each of the data lines. Each of the pixels displays image information based on received signals.

Nowadays, as a resolution of the display device increases, power consumption may increase upon driving the display device. In particular, the power consumption of the display device may occupy most of the power consumption of a small-sized electronic device (e.g., a smartphone, a tablet PC, or an IoT device). Accordingly, there are being developed various methods for reducing power consumption of the display device.

SUMMARY

At least one embodiment is directed to a control integrated circuit for a display panel including an array of pixels, each row of the array associated with a respective gate line of a plurality of gate lines and each column of the array associated with a respective data line of a plurality of data lines.

In one embodiment, the control integrated circuit includes a gate driver configured to selectively drive the plurality of gate lines; a source driver configured to supply data to the display panel; and a controller configured to generate switch control signals for controlling a switch driver of the display panel, the switch driver for selectively supplying the data to the plurality of data lines. The controller is configured to control the gate driver and generate the switch control signals such that the plurality of gate lines are activated non-sequentially, and an order of pixels activated and associated with a same one of the plurality of data lines includes at least two pixels of a same color activated in sequence.

In another embodiment, the control integrated circuit includes a gate driver configured to selectively drive the plurality of gate lines; a source driver configured to supply data to the display panel; and a controller configured to generate switch control signals for controlling a switch driver of the display panel, the switch driver for selectively supplying the data to the plurality of data lines. The controller is configured to control the gate driver and generate the switch control signals such that the plurality of data lines are activated in a first order for a currently activated gate line of the plurality of gate lines, and are activated in a second order for a subsequently activated gate line of the plurality of gate lines (the second order being different from the first order), and an order of pixels activated and associated with a same one of the plurality of data lines includes at least two pixels of a same color activated in sequence.

In a further embodiment, the control integrated circuit includes a gate driver configured to selectively drive the plurality of gate lines; a source driver configured to supply data to the display panel. The controller is configured to generate switch control signals for controlling a switch driver of the display panel, the switch driver for selectively supplying the data to the plurality of data lines, and the controller configured to control the gate driver and generate the switch control signals such that the plurality of gate lines are activated non-sequentially, the plurality of data lines are activated in a first order for a currently activated gate line of the plurality of gate lines, and are activated in a second order for a subsequently activated gate line of the plurality of gate lines (the second order being different from the first order), and an order of pixels activated and associated with a first same one of the plurality of data lines includes a first group of at least two pixels of a first same color activated in sequence.

In an additional embodiment, the control integrated circuit includes a gate driver configured to selectively drive the plurality of gate lines; a source driver configured to supply data to the display panel; and a controller configured to generate switch control signals for controlling a switch driver of the display panel, the switch driver for selectively supplying the data to the plurality of data lines. The controller is configured to control the gate driver and generate the switch control signals such that an order of pixels activated and associated with a same one of the plurality of data lines includes at least two pixels of a same color activated in sequence, and at least one of (i) the plurality of gate lines are activated non-sequentially, and (ii) the plurality of data lines are activated in a first order for a currently activated gate line of the plurality of gate lines, and are activated in a second order for a subsequently activated gate line of the plurality of gate lines, the second order being different from the first order.

At least one embodiment is directed to a display device.

In one embodiment, the display device includes a display panel including an array of pixels. Each row of the array is associated with a respective gate line of a plurality of gate lines, and each column of the array is associated with a respective data line of a plurality of data lines. The display device includes a switch driver for selectively supplying data to the plurality of data lines, and a control integrated circuit configured to selectively drive the plurality of gate lines, configured to supply data to the display panel, configured to generate switch control signals for controlling the switch driver, and configured to selectively drive the plurality of gate lines and generate the switch control signals such that the plurality of gate lines are activated non-sequentially, and an order of pixels activated and associated with a same one of the plurality of data lines includes at least two pixels of a same color activated in sequence.

In another embodiment, the display device includes a display panel including an array of pixels. Each row of the array is associated with a respective gate line of a plurality of gate lines and each column of the array is associated with a respective data line of a plurality of data lines. The display device includes a switch driver for selectively supplying data to the plurality of data lines; and a control integrated circuit configured to selectively drive the plurality of gate lines, configured to supply data to the display panel, configured to generate switch control signals for controlling the switch driver, and configured to selectively drive the plurality of gate lines and generate the switch control signals such that the plurality of data lines are activated in a first order for a currently activated gate line of the plurality of gate lines, and are activated in a second order for a subsequently activated gate line of the plurality of gate lines (the second order being different from the first order), and an order of pixels activated and associated with a same one of the plurality of data lines includes at least two pixels of a same color activated in sequence.

In a further embodiment, the display device includes a display panel including an array of pixels, each row of the array associated with a respective gate line of a plurality of gate lines and each column of the array associated with a respective data line of a plurality of data lines. The display panel includes a switch driver for selectively supplying data to the plurality of data lines; and a control integrated circuit configured to selectively drive the plurality of gate lines, configured to supply data to the display panel, configured to generate switch control signals for controlling the switch driver, and configured to selectively drive the plurality of gate lines and generate the switch control signals such that the plurality of gate lines are activated non-sequentially, the plurality of data lines are activated in a first order for a currently activated gate line of the plurality of gate lines, and are activated in a second order for a subsequently activated gate line of the plurality of gate lines (the second order being different from the first order), and an order of pixels activated and associated with a first same one of the plurality of data lines includes a first group of at least two pixels of a first same color activated in sequence.

At least one embodiment is directed to a method of controlling a display panel including an array of pixels, each row of the array associated with a respective gate line of a plurality of gate lines and each column of the array associated with a respective data line of a plurality of data lines.

In one embodiment, the method includes selectively driving the plurality of gate lines; supplying data to the display panel; and generating switch control signals for controlling a switch driver of the display panel, the switch driver for selectively supplying the data to the plurality of data lines, and driving the gate lines and generating the switch control signals such that the plurality of gate lines are activated non-sequentially, the plurality of data lines are activated in a first order for a currently activated gate line of the plurality of gate lines, and are activated in a second order for a subsequently activated gate line of the plurality of gate lines (the second order being different from the first order), and an order of pixels activated and associated with a first same one of the plurality of data lines includes a first group of at least two pixels of a first same color activated in sequence.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIGS. 4A to 7B are timing diagrams for describing a driving method of the display device according to an embodiment of the inventive concepts;

DETAILED DESCRIPTION

Below, embodiments of the inventive concepts may be described in detail and clearly to such an extent that an ordinary one in the art easily implements the inventive concepts.

Figure 1:
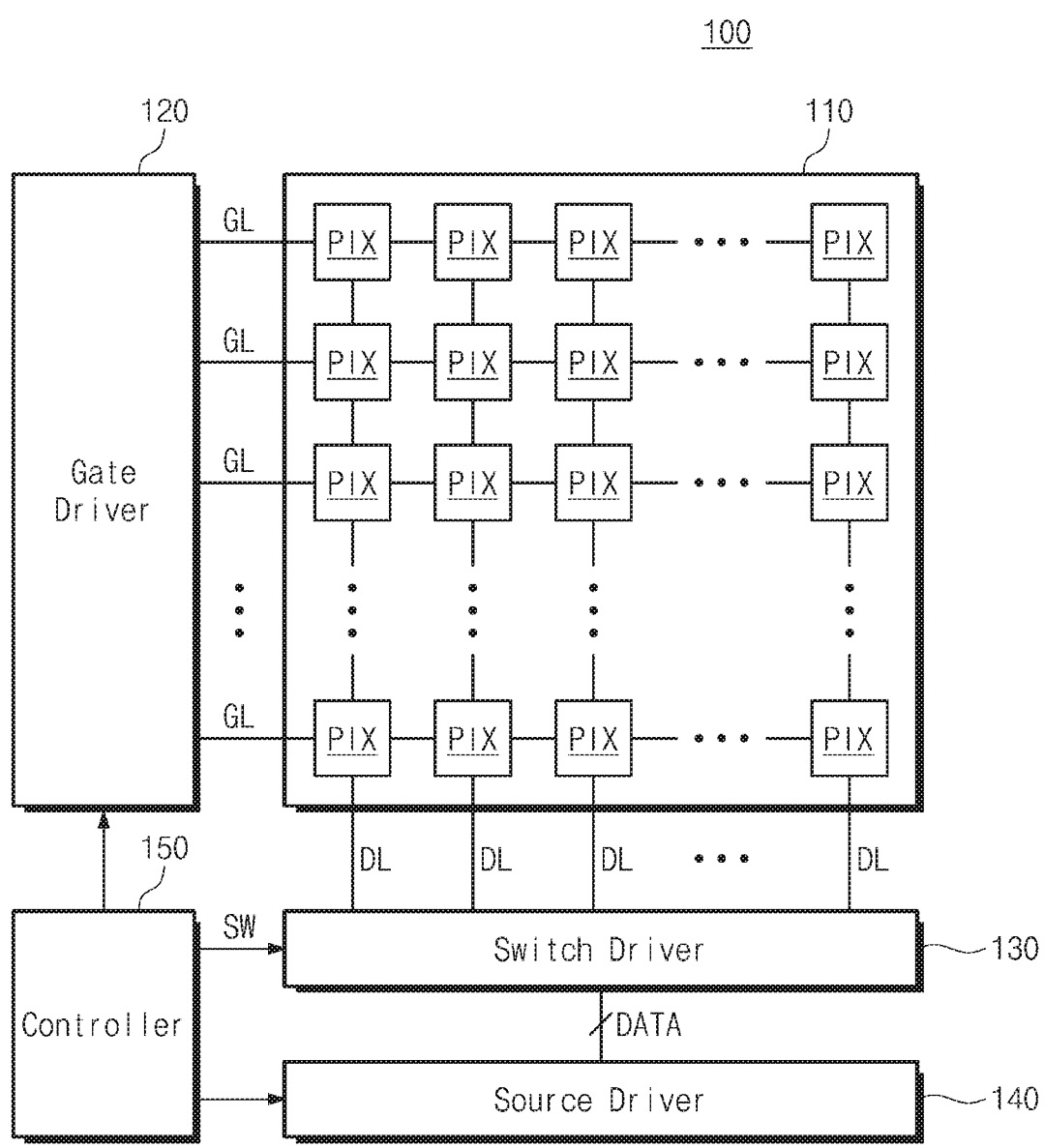
FIG. 1 is a block diagram illustrating a display device according to an embodiment of the inventive concepts.

FIG. 1 is a block diagram illustrating a display device according to an embodiment of the inventive concepts. Referring to FIG. 1, a display device 100 may include a pixel array 110, a gate driver 120, a switch driver 130, a source driver 140, and a controller 150. In an embodiment, the display device 100 may be included in a small-size electronic device, such as a portable communication terminal, a personal digital assistant (PDA), a portable media player (PMP), a smartphone, or a wearable device, or a large-sized electronic product, such as a high-definition television or a monitor.

In an embodiment, function blocks illustrated in FIG. 1 are to distinguish from functions of elements, and the scope and spirit of the inventive concepts may not be limited to a configuration illustrated in FIG. 1. For example, each of the pixel array 110, the gate driver 120, the switch driver 130, the source driver 140, and the controller 150 may be implemented with a separate semiconductor die, chip, or module. Alternatively, all or some of the pixel array 110, the gate driver 120, the switch driver 130, the source driver 140, and the controller 150 may be implemented with a semiconductor die, chip, or module.

Also, the pixel array 110, the gate driver 120, and the switch driver 130 may be included in one display panel after being formed on the same semiconductor substrate. In this case, the gate driver 120 and the switch driver 130 may be provided as peripheral circuits of the display panel.

Alternatively, the source driver 140 and the controller 150 may be implemented with a semiconductor die, chip, or module. Alternatively, the gate driver 120, the switch driver 130, the source driver 140, and the controller 150 may be provided as a display device controller to control the display device 100 after being implemented with a semiconductor die, chip, or module.

The pixel array 110 may include a plurality of pixels PIX. Each of the pixels PIX may be connected with a gate line GL and a data line DL and may be configured to display image information in response to voltages or signals of the gate line GL and the data line DL. The pixels PIX may be divided into a plurality of groups depending on colors to be displayed. For example, each of the pixels PIX may be configured to display one of several primary colors. The primary colors may include at least one of red, green, blue, and white. Alternatively, the primary colors may further include various colors such as magenta, cyan, and yellow. Below, a color that a pixel displays is referred to as a "pixel color". The pixel color may be determined according to an element of each pixel or a color filter included in each pixel.

In an embodiment, the pixel array 110 may be implemented with various display panels such as an organic light emitting display (OLED) panel, a liquid crystal display (LCD) panel, an electrophoretic display panel, and an electrowetting display panel. However, the pixel array 110 according to an embodiment of the inventive concepts are not limited thereto. For example, the pixel array 110 according to an embodiment of the inventive concepts may be implemented with the above-described display panels or other display panels. In an embodiment, the display device 100 including the liquid crystal display (LCD) panel may further include a polarizer (not illustrated), a backlight unit (not illustrated), etc.

The gate driver 120 may be configured to control a plurality of gate lines GL under control of the controller 150. For example, the gate driver 120 may be configured to provide a gate signal to each of the gate lines GL under control of the controller 150. In an embodiment, the gate signal may indicate a signal for activating pixels PIX connected with the corresponding gate line.

The switch driver 130 may be connected with the pixels PIX through a plurality of data lines DL. The switch driver 130 may be configured to provide a data signal from the source driver 140 to the corresponding data line DL under control of the controller 150. For example, the switch driver 130 may be implemented in the form of a 1:2 demultiplexer, a 1:3 demultiplexer, or a 1:n demultiplexer. The switch driver 130 may perform a switching operation in response to a switch signal SW from the controller 150 such that a data signal DATA provided from the source driver 140 is provided to any one data line DL.

The source driver 140 may generate the data signal DATA to be provided to each pixel PIX under control of the controller 150. The generated data signal DATA may be provided to each pixel PIX through the switch driver 130.

The controller 150 may be configured to control the gate driver 120, the switch driver 130, and the source driver 140 such that each of the pixels PIX display corresponding image information. The controller 150 may be a timing controller (TCON) that generates various control signals (e.g., a vertical synchronization signal and a horizontal synchronization signal) for controlling the gate driver 120, the switch driver 130, and the source driver 140. In an embodiment, although not illustrated clearly in FIG. 1, the controller 150 may be included in the source driver 140, and the source driver 140 may be configured to perform an operation (e.g., control of the switch signal SW) of the controller 150.

In an embodiment, the display device 100 may select an active pixel among the plurality of pixels PIX by controlling the gate line GL and the switch signal SW. In this case, the active pixel may refer to a pixel that displays image information in response to a data signal from the source driver 140. That is, to activate a specific pixel (referred to as a "first pixel"), the display device 100 may activate the gate line GL connected with the first pixel and may control the switch signal SW such that the data signal DATA is provided to the data line DL connected with the first pixel. As such, the data signal DATA may be provided to the first pixel from the source driver 140 by controlling the gate line GL and the switch signal SW. The display device 100 may repeat the above-described operation to allow each pixel PIX to display image information associated with the data signal DATA.

The display device 100 according to an embodiment of the inventive concepts may control the gate line GL and the switch signal SW such that power consumption is reduced or minimized to display image information. For example, the display device 100 may activate the gate line GL such that pixels having the same pixel color are displayed to be continuous or adjacent to each other. For example, the display device 100 may activate the switch signal SW such that pixels having the same pixel color are displayed to be continuous or adjacent to each other. In this case, pixels of the same color may be pixels connected with the same data line.

Since the display device 100 controls the gate line GL or the switch signal SW such that pixels having the same pixel color are displayed to be continuous or adjacent to each other, power consumed to charge/discharge the data line DL or a capacitor in the switch driver 130 or power consumption due to a change in a pixel color on the source driver 140 may decrease. Below, a method in which the display device 100 according to an embodiment of the inventive concepts controls the gate line GL and the switch signal SW will be more fully described with reference to drawings.

Figure 2:
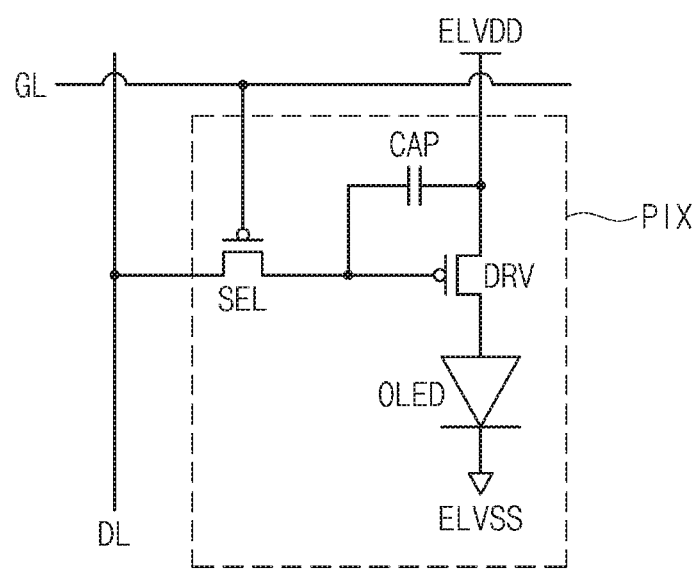
FIG. 2 is a circuit diagram illustrating a structure of a pixel of FIG. 1.

FIG. 2 is a circuit diagram illustrating a structure of a pixel of FIG. 1. A structure of one pixel PIX will be described with reference to FIG. 2. However, the remaining pixels may have a structure to the same as or similar to the pixel PIX of FIG. 2. Also, a structure of an organic light emitting display (OLED) pixel will be described with reference to FIG. 2. However, embodiments of the inventive concepts may not be limited thereto. For example, a pixel structure may be variously changed or modified.

Referring to FIGS. 1 and 2, the pixel PIX may include a select transistor SEL, a driving transistor DRV, a capacitor CAP, and an organic light-emitting element OLED. In an embodiment, the pixel PIX of FIG. 2 has a pixel structure including two transistors SEL and DRV. However, embodiments of the inventive concepts may not be limited thereto.

An anode of the organic light-emitting element OLED is connected to receive a first power supply voltage ELVDD through the driving transistor DRV. A cathode of the organic light-emitting element OLED is connected to receive a second power supply voltage ELVSS. The select transistor SEL outputs a data signal to be applied to the data line DL to the driving transistor DRV and capacitor CAP in response to a signal applied to the gate line GL. The capacitor CAP charges or discharges a voltage corresponding to the data signal from the select transistor SEL. The driving transistor DRV may control a driving current flowing to the organic light-emitting element OLED based on a voltage stored in the capacitor CAP. In an embodiment, the second power supply voltage ELVSS may be a ground voltage. The organic light-emitting element OLED emits light when the driving current is applied thereto. In an embodiment, the organic light-emitting element OLED may be configured to express any one color (i.e., a pixel color) among red, green, blue, or white based on an implementation manner.

Figure 3:
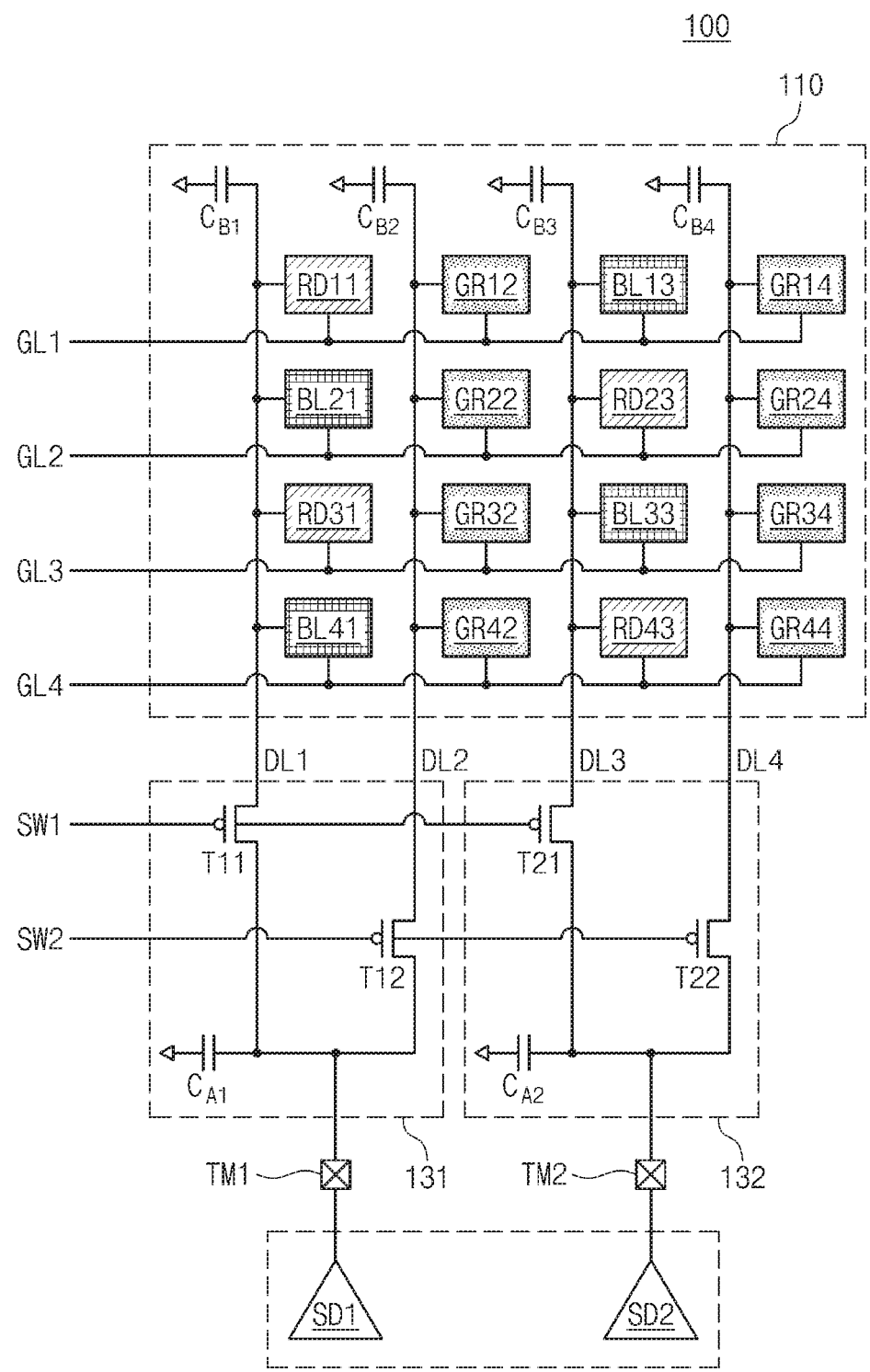
FIG. 3 is a block diagram illustrating the display device of FIG. 1.

FIG. 3 is a block diagram illustrating a display device of FIG. 1. For ease of illustration and for convenience of description, it is assumed that a plurality of pixels are arranged in the form of a 4-by-4 array. Also, in FIG. 3, a reference mark is applied to each pixel based on the corresponding pixel color. That is, a reference mark "RD" is applied to a pixel of which a pixel color is red, a reference mark "GR" to a pixel of which a pixel color is green, and a reference mark "BL" to a pixel of which a pixel color is blue. That is, a reference mark applied to each pixel is to express simply a pixel color and does not limit the scope and spirit of the inventive concepts.

Also, for brevity of illustration, the gate driver 120 is omitted in FIG. 3. However, it may be understood that a plurality of gate lines GL1 to GL4 are controlled by the gate driver 120. Also, it is assumed that the switch driver 130 includes first and second switch circuits 131 and 132 and each of the switch circuits 131 and 132 is a 1:2 demultiplexer. The above-described configuration of the switch driver 130 is to describe an embodiment of the inventive concepts easily and clearly, and the scope of the inventive concepts are not limited thereto.

Referring to FIGS. 1 and 3, the pixel array 110 may include a plurality of pixels RD11, GR12, BL13, GR14, BL21, GR22, RD23, GR24, RD31, GR32, BL33, GR34, BL41, GR42, RD43, and GR44. The plurality of pixels RD11, GR12, BL13, GR14, BL21, GR22, RD23, GR24, RD31, GR32, BL33, GR34, BL41, GR42, RD43, and GR44 may be arranged in a pentile structure as illustrated in FIG. 3. However, the pixel arrangement illustrated in FIG. 3 is only an example, and the scope of the inventive concepts are not limited thereto.

The plurality of pixels are connected with first to fourth gate lines GL1 to GL4 and first to fourth data lines DL1 to DL4. The plurality of pixels may be activated by the corresponding gate lines, and activated pixels may display the corresponding pixel colors in response to voltages of the corresponding data lines.

In an embodiment, each of the plurality of pixels RD11, GR12, BL13, GR14, BL21, GR22, RD23, GR24, RD31, GR32, BL33, GR34, BL41, GR42, RD43, and GR44 illustrated in FIG. 3 may be a sub pixel. Some sub pixels may constitute one pixel capable of expressing various colors. However, to make embodiments of the inventive concepts clear, an element that expresses one pixel color is referred to as a "pixel". However, it may be understood that a pixel disclosed in this specification is a sub pixel and a plurality of sub pixels constitute a single pixel.

The first switch circuit 131 may be connected with the first and second data lines DL1 and DL2, the second switch circuit 132 may be connected with the third and fourth data lines DL3 and DL4, and the first and second switch circuits 131 and 132 may perform switch operations in response to first and second switch signals SW1 and SW2, respectively.

For example, the first switch circuit 131 may include transistors T11 and T12. A first end of the transistor T11 is connected with the first data line DL1, a second end thereof is connected with a first terminal TM1, and a gate thereof is configured to receive the first switch signal SW1. The transistor T11 provides a signal (or voltage) of the first terminal TM1 to the first data line DL1 in response to the first switch signal SW1. A first end of the transistor T12 is connected with the second data line DL2, a second end thereof is connected with the first terminal TM1, and a gate thereof is configured to receive the second switch signal SW2. The transistor T12 provides a signal (or voltage) of the first terminal TM1 to the second data line DL2 in response to the second switch signal SW2.

As in the above description, the second switch circuit 132 may include transistors T21 and T22. A first end of the transistor T21 is connected with the third data line DL3, a second end thereof is connected with a second terminal TM2, and a gate thereof is configured to receive the first switch signal SW1. The transistor T21 provides a signal (or voltage) of the second terminal TM2 to the third data line DL3 in response to the first switch signal SW1. A first end of the transistor T22 is connected with the fourth data line DL4, a second end thereof is connected with the second terminal TM2, and a gate thereof is configured to receive the second switch signal SW2. The transistor T22 provides a signal (or voltage) of the second terminal TM2 to the fourth data line DL4 in response to the second switch signal SW2.

As described above, the first switch circuit 131 may be implemented in the form of a 1:2 demultiplexer for selectively connecting the first terminal TM1 to the first and second data lines DL1 and DL2 in response to the first and second switch signals SW1 and SW2, and the second switch circuit 132 may be implemented in the form of a 1:2 demultiplexer for selectively connecting the second terminal TM2 to the third and fourth data lines DL3 and DL4 in response to the first and second switch signals SW1 and SW2. However, embodiments of the inventive concepts may not be limited thereto. Each of the switch circuits 131 and 132 may be implemented in the form of a 1:n demultiplexer (n being an integer greater than 2).

The source driver 140 may include first and second source driving units SD1 and SD2. The first source driving unit SD1 may be connected with the first terminal TM1 to provide the corresponding data signal through the first terminal TM1, and the second source driving unit SD2 may be connected with the second terminal TM2 to provide the corresponding data signal through the second terminal TM2.

In an embodiment, an operation in which the pixels RD11, GR12, BL13, and GR14 connected with the first gate line GL1 display image information will be described. The first gate line GL1 is first activated to allow the pixels RD11, GR12, BL13, and GR14 connected with the first gate line GL1 to display image information. Here, "that a gate line is activated" may mean that a turn-on voltage is provided to a gate line such that the select transistor SEL (refer to FIG. 2) of each of pixels connected with the gate line are tuned on.

In an active interval of the first gate line GL1, the corresponding data signals may be respectively provided to the pixels RD11, GR12, BL13, and GR14 connected with the first gate line GL1 by sequentially activating the first and second switch signals SW1 and SW2. For example, in the case where the first switch signal SW1 is activated, the first terminal TM1 and the first data line DL1 are connected to each other by the first switch circuit 131, and the second terminal TM2 and the third data line DL3 are connected to each other by the second switch circuit 132. In this case, the first source driving unit SD1 may provide a data signal corresponding to the pixel RD11, and the second source driving unit SD2 may provide a data signal corresponding to the pixel BL13.

For example, in the case where the second switch signal SW2 is activated, the first terminal TM1 and the second data line DL2 are connected to each other by the first switch circuit 131, and the second terminal TM2 and the fourth data line DL4 are connected to each other by the second switch circuit 132. In this case, the first source driving unit SD1 may provide a data signal corresponding to the pixel GR12, and the second source driving unit SD2 may provide a data signal corresponding to the pixel GR14.

As described above, each of the plurality of pixels may display image information (or color) corresponding to a data signal by controlling the gate lines GL1 to GL4 and the switch signals SW1 and SW2.

In an embodiment, power may be consumed due to various factors while each of the plurality of pixels displays image information. The first and second source driving units SD1 and SD2 may provide data signals through the first and second terminals TM1 and TM2, respectively. In the case where the switch signals SW1 and SW2 are changed, since a to-be-displayed pixel color of a pixel is changed, levels of data signals from the first and second source driving units SD1 and SD2 may be changed.

When the levels of the data signals are changed, voltages of lines connected with the first and second terminals TM1 and TM2 may be charged or discharged. The above-described charging or discharging operation of the first and second terminals TM1 and TM2 may be expressed with capacitors $C_{A1}$ and $C_{A2}$ of the lines connected with the first and second terminals TM1 and TM2 as illustrated in FIG. 3. That is, power charged/discharged according to a level change of the data signals from the first and second source driving units SD1 and SD2 may be expressed with charging/discharging power of the capacitors $C_{A1}$ and $C_{A2}$.

Likewise, in each of the first to fourth data lines DL1 to DL4, a level of a data signal from each of the first and second source driving units SD1 and SD2 may be changed when another gate line is activated. Since the level of the data signal is changed, voltages of the first to fourth data lines DL1 to DL4 may be charged or discharged. The above-described charging or discharging operation of the first to fourth data lines DL1 to DL4 may be expressed with capacitors $C_{B1}$ to $C_{B4}$ respectively connected with the first to fourth data lines DL1 to DL4 as illustrated in FIG. 3. That is, power consumed to charge/discharge the first to fourth data lines DL1 to DL4 may be expressed with charging/discharging power of the capacitors $C_{B1}$ to $C_{B4}$.

In an embodiment, power consumption of the display device 100 may be reduced or minimized by minimizing power charged/discharged by the capacitors $C_{A1}$ and $C_{A2}$ and the capacitors $C_{B1}$ to $C_{B4}$. The display device 100 according to an embodiment of the inventive concepts may reduce or minimize power charged/discharged by the capacitors $C_{A1}$ and $C_{A2}$ and the capacitors $C_{B1}$ to $C_{B4}$ by non-sequentially controlling the gate lines GL1 to GL4 and the switch signals SW11 and SW2. A driving method of the display device 100 according to an embodiment of the inventive concepts will be more fully described with reference to the following timing diagrams.

FIGS. 4A to 7B are timing diagrams for describing a driving method of a display device according to an embodiment of the inventive concepts. In FIGS. 4A to 7B, a horizontal axis represents a time. Below, for a brief description, a driving method of the display device 100 will be described with reference to pixels (i.e., RD11, GR12, BL21, GR22, RD31, GR32, BL41, and GR42), which are connected with the first and second data lines DL1 and DL2, from among pixels of FIG. 3, the first switch circuit 131, and the first source driving unit SD1. However, the scope and spirit of the inventive concepts may not be limited thereto, and other pixels, other switch circuits, and other source driving units may operate in a manner that is similar to a manner to be described with reference to FIGS. 4 to 7.

In an embodiment, in each of the timing diagrams of FIGS. 4A to 7B, a first section indicates voltage levels (or gate signals) of the first to fourth gate lines GL1 to GL4, a second section indicates levels of the first and second switch signals SW1 and SW2 and active pixels, and a third section indicates a voltage level of the first source driving unit SD1, which is determined according to a color of image information to be displayed by each pixel.

In an embodiment, in the third section, a reference mark of "Red" may mean that image information to be displayed (or a screen to be displayed) by pixels indicates a red color, and a timing diagram corresponding to the reference mark of "Red" may indicate an output voltage of the first source driving unit SD1 when image information of a red color is displayed. Each of reference marks of "Green", "Blue", "Magenta", "Cyan", and "Yellow" may indicate a voltage level of the first source driving unit SD1 when image information of the corresponding color is output.

In an embodiment, in the case where image information of a red color is displayed, only pixels (i.e., "RD" pixels) may emit light, and the remaining other pixels (i.e., "GR" pixels and "BL" pixels) may operate so as not to emit light. Likewise, in a reference mark of "Green", only the "GR" pixels may emit light, and the "RD" and "BL" pixels may operate so as not to emit light. In a reference mark of "Blue", only the "BL" pixels may emit light, and the "RD" and "GR" pixels may operate so as not to emit light. In a reference mark of "Magenta", only the "RD" and "BL" pixels may emit light, and the "GR" pixels may operate so as not to emit light. In a reference mark of "Cyan", only the "GR" and "BL" pixels may emit light, and the "RD" pixels may operate so as not to emit light. In a reference mark of "Yellow", only the "RD" and "GR" pixels may emit light, and the "BL" pixels may operate so as not to emit light.

In an embodiment, in the timing diagrams of FIGS. 4 to 7, it is assumed that each pixel is activated or emits light in response to a signal of a low level "L". For example, in the case where the first gate line GL1 is activated, a level of the first gate line GL1 is the low level "L". The first switch circuit 131 may provide a data signal from the first source driving unit SD1 to the "RD11" pixel in response to the first switch signal SW1 of the low level "L". That is, the "RD11" pixel is activated when levels of the first gate line GL1 and the first switch signal SW1 are the low level "L". In this case, when a level of a data signal from the first source driving unit SD1 is the low level "L", the "RD11" pixel may emit light to display a pixel color of a red color; when the level of the data signal is a high level "H", the "RD11" pixel may not emit light.

In an embodiment, in the timing diagrams of FIGS. 4 to 7, the low level "L" and the high level "H" of each signal and each voltage may be relative values. That is, low/high levels "L/H" of the first gate line GL1 may be different from low/high levels of the first switch signal SW1 or levels of low/high signals of the first source driving unit SD1.

That is, as described above, the timing diagrams illustrated in FIGS. 4 to 7 are to describe the scope and spirit of the inventive concepts easily without being limited thereto. Also, it may be well understood that actual waveforms of signals are modified from waveforms illustrated in FIGS. 4 to 7.

Also, below, for convenience of description, it is assumed that activation of a specific gate line means that a gate signal (i.e., a signal of a low level) is provided to the specific gate line such that select transistors of pixels connected with the specific gate line are turned on. Also, it is assumed that activation of a specific switch signal means that the specific switch signal of the low level "L" is provided to a switch circuit such that a data signal is provided to a data line corresponding to the specific switch signal. Also, it is assumed that activation of a specific pixel means that a data signal is provided to a data line connected with the specific pixel in a state where a gate line connected with the specific pixel is activated and a specific switch signal is activated.

Also, below, for convenience of description, the capacitor $C_{A1}$ connected with the first terminal TM1 is referred to as a "driving cap", and the capacitors $C_{B1}$ and $C_{B2}$ respectively connected with the first and second data lines DL1 and DL2 are respectively referred to as "first and second line caps". The driving cap and the line caps may be parasitic capacitors that exist in a display device.

In an embodiment, since no power is consumed to discharge the driving cap $C_{A1}$ and the first and second line caps $C_{B1}$ and $C_{B2}$ or since power consumed to discharge the caps $C_{A1}$, $C_{B1}$, and $C_{B2}$ is very small compared with power consumed to charge the caps $C_{A1}$, $C_{B1}$, and $C_{B2}$, power consumption of the display device 100 is determined only in consideration of power consumed to charge the caps $C_{A1}$, $C_{B1}$, and $C_{B2}$.

However, limits of the terms or assumptions for convenience of description are to describe simply the scope and spirit of the inventive concepts clearly and easily, and the scope and spirit of the inventive concepts are not limited thereto.

Figure 4A:
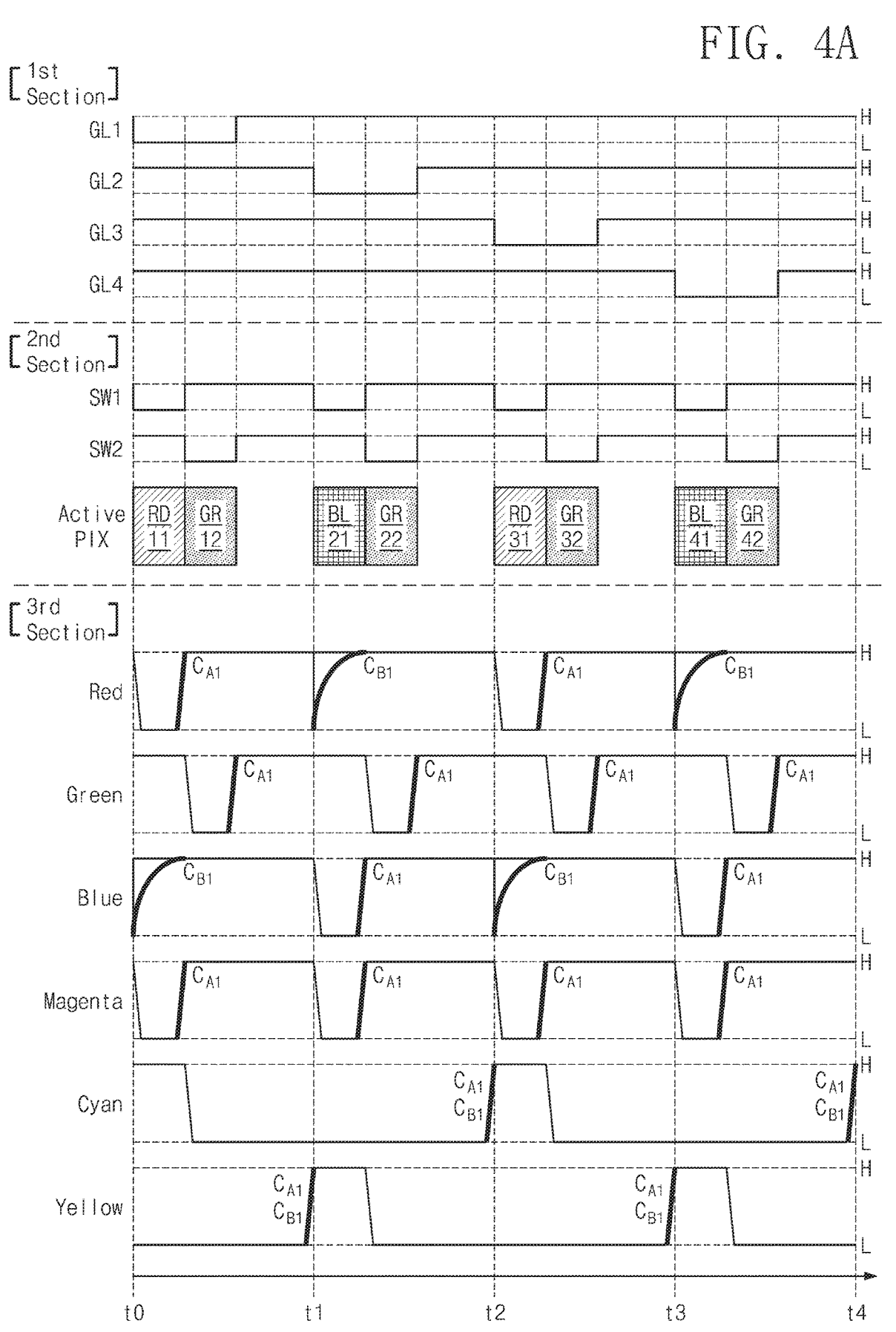

Referring to FIGS. 1, 3, and 4A, the gate driver 120 may sequentially activate the first to fourth gate lines GL1 to GL4. For example, as illustrated in the first section of FIG. 4A, the gate driver 120 may activate the first gate line GL1 at a 0-th time point t0, may activate the second gate line GL2 at a first time point t1, may activate the third gate line GL3 at a second time point t2, and may activate the fourth gate line GL4 at a third time point t3.

In an active period of each of the first to fourth gate lines GL1 to GL4, the first switch circuit 131 may operate in response to the first and second switch signals SW1 and SW2. In this case, the first and second switch signals SW1 and SW2 may be activated alternately (or sequentially) in the active period of each of the first to fourth gate lines GL1 to GL4.

For example, in the active period of the first gate line GL1, the second switch signal SW2 may be activated after the first switch signal SW1 is activated. In the active period of the second gate line GL2, the second switch signal SW2 may be activated after the first switch signal SW1 is activated. Likewise, in the active period of each of the third and fourth gate lines GL3 and GL4, the second switch signal SW2 may be activated after the first switch signal SW1 is activated.

As described above, when the first to fourth gate lines GL1 to GL4 and the first and second switch signals SW1 and SW2 are activated, pixels may be activated in an order of RD11→GR12→BL21→GR22→RD31→GR32→BL41→GR42.

In the third section of FIG. 4A, an operation of the first source driving unit SD1 will be described with reference to the event that image information of a red color is displayed. As described above, to display image information of the red color, the first source driving unit SD1 may provide a data signal such that only the "RD" pixel emits light and the remaining "GR" and "BL" pixels do not emit light.

For example, it is assumed that the first and second caps $C_{B1}$ and $C_{B2}$ are at a high-level state at a 0-th time point t0. In an active period of the "RD11" pixel, the first data line DL1 and the first terminal TM1 are connected to each other, and the first source driving unit SD1 may provide a data signal of the low level "L" such that the "RD11" pixel emits light. In this case, the driving cap $C_{A1}$ and the first line cap $C_{B1}$ may be discharged to a low level.

Afterwards, in an active period of the "GR12" pixel, the second data line DL2 and the first terminal TM1 are connected to each other, and the first source driving unit SD1 may provide a data signal of the high level "H" such that the "GR12" pixel does not emit light. In this case, the driving cap $C_{A1}$ is at a discharged state to the low level "L" in the active period of the "RD11" pixel, and a level of the second line cap $C_{B2}$ is the high level "H". That is, the first source driving unit SD1 may consume power for charging the driving cap $C_{A1}$ to the high level "H". The power thus consumed may be expressed with a capacity of the driving cap $C_{A1}$.

Afterwards, in an active period of the "BL21" pixel, the first data line DL1 and the first terminal TM1 are connected to each other, and the first source driving unit SD1 may provide a data signal of the high level "H" such that the "BL21" pixel does not emit light. In this case, the driving cap $C_{A1}$ is at a charged state to the high level "H" in the active period of the "GR12" pixel, and the first line cap $C_{B1}$ is at a discharged state to the low level "L" in the active period of the "RD11" pixel. That is, the first source driving unit SD1 may consume power for charging the first line cap $C^{B1}$ to the high level "H".

Afterwards, in an active period of the "GR22" pixel, the second data line DL2 and the first terminal TM1 are connected to each other, and the first source driving unit SD1 may provide a data signal of the high level "H" such that the "GR22" pixel does not emit light. In this case, the driving cap $C_{A1}$ is at a charged state to the high level "H" in the active period of the "BL21" pixel, and the second line cap $C_{B2}$ is at a charged state to the high level "H" in the active period of the "GR12" pixel. That is, the first source driving unit SD1 may not consume power for charging the second line cap $C_{B2}$.

In an active period of the "RD31" pixel, the first data line DL1 and the first terminal TM1 are connected to each other, and the first source driving unit SD1 may provide a data signal of the low level "L" such that the "RD31" pixel emits light. In this case, the first source driving unit SD1 may discharge the driving cap $C_{A1}$ and the first line cap $C_{B1}$ to the low level "L".

Afterwards, in an active period of the "GR32" pixel, the second data line DL2 and the first terminal TM1 are connected to each other, and the first source driving unit SD1 may provide a data signal of the high level "H" such that the "GR32" pixel does not emit light. In this case, the driving cap $C_{A1}$ is at a discharged state to the low level "L" in the active period of the "RD31" pixel, and the second line cap $C_{B2}$ is at a charged state to the high level "H" in the active period of the "GR22" pixel. That is, the first source driving unit SD1 may consume power for charging the driving cap $C_{A1}$ to the high level "H".

Afterwards, in active periods of the "BL41" and "GR42" pixels, the first source driving unit SD1 provides a data signal of the high level "H" such that the "BL41" and "GR42" pixels do not emit light, thereby consuming power for charging the first line cap $C_{B1}$. The active periods of the "BL41" and "GR42" pixels are sufficiently the same as the active periods of the "BL21" and "GR22" pixels that a description thereof is thus omitted.

As described above, to display image information of the red color, the first source driving unit SD1 may consume power of "$2C_{A1}+2C_{B1}$" while the first to fourth gate lines GL1 to GL4 are activated. For clarity of illustration, a period (i.e., a cap charging period) in which power is consumed is marked with a bold solid line in FIG. 4A.

Likewise, in the case of displaying image information of each of green, blue, magenta, cyan, and yellow colors, as illustrated in FIG. 4A, power may be consumed to charge the driving cap $C_{A1}$ based on a data signal (or a pixel color) associated with an immediately previously activated pixel, and power may be consumed to charge the first and second line caps $C_{B1}$ and $C_{B2}$ based on a data signal (or a pixel color) associated with a pixel, which is activated lastly, from among pixels connected with the same data line. The following table 1 shows power consumed according to each display color illustrated in FIG. 4A.

TABLE 1

| Display colors | Red | Green | Blue | Magenta | Cyan | Yellow |
|---|---|---|---|---|---|---|
| Display pixels RD/GR/BL/GR | L/H/H/H | H/L/H/L | H/H/L/H | L/H/L/H | H/L/L/L | L/L/H/L |
| Consumed power | $2C_{A1} + 2C_{B1}$ | $4C_{A1}$ | $2C_{A1} + 2C_{B1}$ | $4C_{A1}$ | $2C_{A1} + 2C_{B1}$ | $2C_{A1} + 2C_{B1}$ |

Referring to table 1, the display colors indicate colors of image information to be displayed by a plurality of pixels, and the display pixels indicate pixel colors of pixels emitting light based on the display colors. Here, a pixel marked with the low level "L" emits light, and a pixel marked with the high level "H" does not emit light. The consumed power indicates power consumed according to the display color.

Power consumed to drive two data lines DL1 and DL2 while the four gate lines GL1 to GL4 are activated is illustrated in table 1. As understood from FIG. 4 and table 1, the driving cap $C_{A1}$ may be charged or discharged according to a level of a data signal (or a pixel color) associated with an immediately previously activated pixel, and the first and second line caps $C_{B1}$ and $C_{B2}$ may be charged or discharged according to a data signal (or a pixel color) associated with a pixel (or the last pixel), which is recently activated, from among pixels connected with the same data line.

Figure 4B:
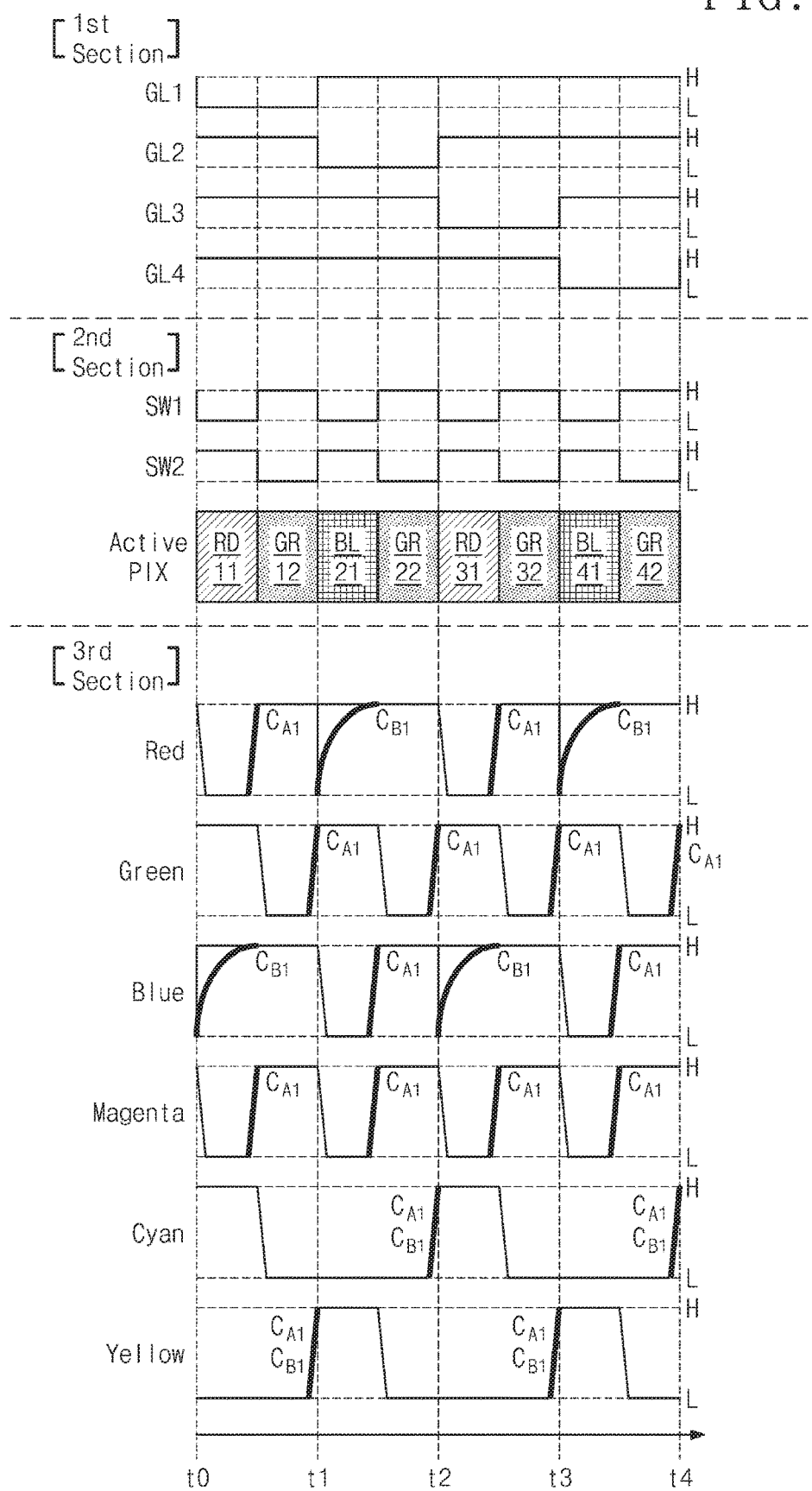

In example embodiments, unlike the embodiment of FIG. 4A, an example embodiment of FIG. 4B shows that periods for transition of activated gate lines is omitted. For example, in FIG. 4A, the second gate line GL2 may be activated, after predetermined time lapses when the first gate line GL1 has been deactivated. However, according to the example embodiment of FIG. 4B, the second gate line GL2 may be activated, directly after the first gate line GL1 is deactivated. That is, according to the example embodiment of FIG. 4B, the plurality of gate lines are activated in an order of GL1→GL2→GL3→GL4, consecutively (or, without intermediate time or delay time or null function period, etc.). In example embodiments, in each of activation periods of gate lines, the first and second switch signals SW1 and SW2 may be activated in a manner that is similar to a manner to be described with reference to FIG. 4A. In the example embodiments of FIG. 4B, as an operation method except the matter is similar to FIG. 4A, the description thereof is omitted.

Figure 5A:
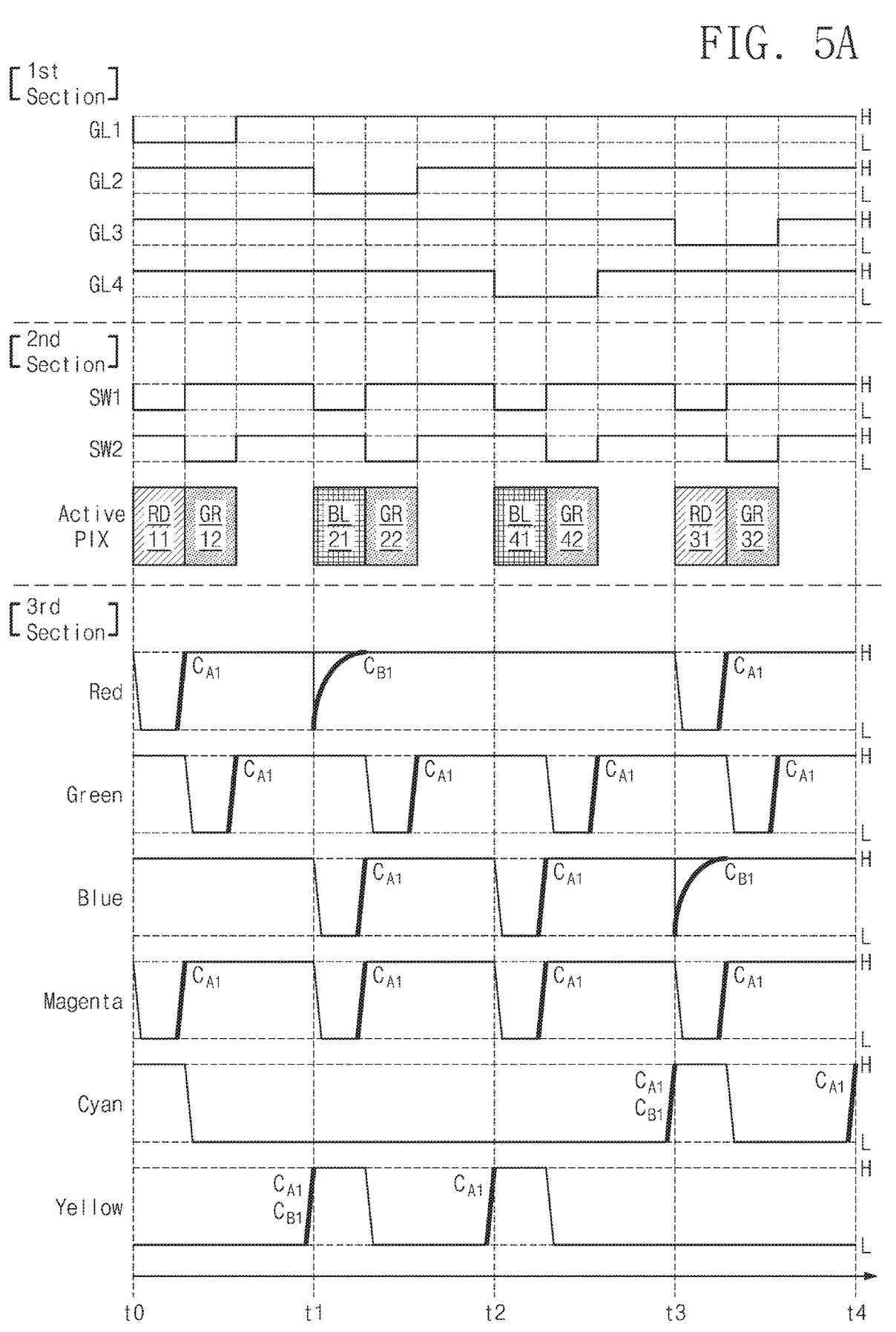

Referring to FIGS. 1, 3, and 5A, the gate driver 120 may non-sequentially activate the first to fourth gate lines GL1 to GL4. In an embodiment, that the first to fourth gate lines GL1 to GL4 are non-sequentially activated means that the first to fourth gate lines GL1 to GL4 are activated in an order different from a physically disposed order (e.g., an order from an upper gate line to a lower gate line). For example, in the embodiment described with reference to FIG. 4A, gate lines may be sequentially activated in an order of GL1→GL2→GL3→GL4 (or in a physically disposed order). However, in the embodiment of FIG. 5A, gate lines may be non-sequentially activated in an order of GL1→GL2→GL4→GL3 (or in an order different from a physically disposed order).

In an embodiment, according to the embodiment of FIG. 5A, gate lines that are continuously activated may not be adjacent to each other physically. For example, according to the embodiment of FIG. 5, the fourth gate line GL4 may be activated after the second gate line GL2 is activated. In this case, the second and fourth gate lines GL2 and GL4 are gate lines that are continuously activated but are not adjacent to each other physically.

In an embodiment, in FIG. 5A, an order in which the gate lines GL1 to GL4 are activated may be implemented by changing a configuration of the gate driver 120 or an order in which the gate lines GL1 to GL4 are connected.

As in the description given with reference to FIG. 4, the first and second switch signals SW1 and SW2 may be activated sequentially (i.e., an order of SW1→SW2) in the active period of each of the first to fourth gate lines GL1 to GL4.

As illustrated in FIG. 5A, when the first to fourth gate lines GL1 to GL4 and the first and second switch signals SW1 and SW2 are activated, pixels may be activated in an order of RD11→GR12→BL21→GR22→BL41→GR42→RD31→GR32.

As in the above description, in the third section of FIG. 5A, an operation of the first source driving unit SD1 will be described with reference to the event that image information of a red color is displayed.

When image information of the red color is displayed, a data signal may be provided to each pixel such that only the "RD" pixel emits light and other pixels (e.g., "GR" and "BL" pixels) do not emit light. In active periods of the "RD11", "GR12", "BL21", and "GR22" pixels, the first source driving unit SD1 may provide a data signal such that only the "RD11" pixel emits light. In this case, the first source driving unit SD1 may consume power for charging the driving cap $C_{A1}$ and the first line cap $C_{B1}$. Operations of the active periods of the "RD11", "GR12", "BL21", and "GR22" pixels of FIG. 5A are the same as operations of the active periods of the "RD11", "GR12", "BL21", and "GR22" pixels of FIG. 4, and a detailed description thereof is thus omitted.

As illustrated in FIG. 5A, as an order in which gate lines are activated is changed (i.e., the gate lines are activated in an order of GL1→GL2→GL4→GL3), the "BL41" pixel may be activated after the active period of the "GR22" pixel. In an active period of the "BL41" pixel, the first source driving unit SD1 may provide a data signal of the high level "H" such that the "BL41" pixel does not emit light. In this case, the driving cap $C_{A1}$ is at a charged state to the high level "H" in the active period of the "GR22" pixel, and the first line cap $C_{B1}$ is at a charged state to the high level "H" in the active period of the "BL21" pixel. That is, charging of the driving cap $C_{A1}$ and the first line cap $C_{B1}$ may not be performed for the first source driving unit SD1 to provide a data signal of the high level "H" to the "BL41" pixel.

Likewise, in an active period of the "GR42" pixel, the first source driving unit SD1 may provide a data signal of the high level "H" such that the "GR42" pixel does not emit light. In this case, since the driving cap $C_{A1}$ is at a charged state to the high level "H" in the active period of the "BL41" pixel and the second line cap $C_{B2}$ is at a charged state to the high level "H" in the active period of the "GR22" pixel, separate charging may not be performed.

Afterwards, in active periods of the "RD31" and "GR32" pixels, the first source driving unit SD1 consumes power to charge the driving cap $C_{A1}$ t0 the high level "H". The active periods of the "RD31" and "GR32" pixels are sufficiently the same as the active periods of the "RD1 1" and "GR12" pixels that a description thereof is thus omitted.

According to the embodiment illustrated in FIG. 5A, to display image information of the red color, the first source driving unit SD11 may consume power of "$2C_{A1}+C_{B1}$" while the first to fourth gate lines GL to GL4 are activated. For clarity of illustration, a period (i.e., a cap charging period) in which power is consumed is marked with a bold solid line in FIG. 5A.

Also, power consumed to display other colors, for example, green, blue, magenta, cyan, and yellow colors is marked with a bold solid line in FIG. 5. Consumed power marked with the bold solid line in FIG. 5 may be power consumed to charge the driving cap $C_{A1}$ based on a data signal (or a pixel color) associated with an immediately previously activated pixel or may be power consumed to charge the first and second line caps $C_{B1}$ and $C_{B2}$ based on a data signal (or a pixel color) associated with a pixel, which is activated lastly, from among pixels connected with the same data line. The following table 2 shows power consumed to display each color in the embodiment of FIG. 5A.

TABLE 2

| Display colors | Red | Green | Blue | Magenta | Cyan | Yellow |
|---|---|---|---|---|---|---|
| Display pixels RD/GR/BL/GR | L/H/H/H | H/L/H/L | H/H/L/H | L/H/L/H | H/L/L/L | L/L/H/L |
| Consumed power | $2C_{A1} + C_{B1}$ | $4C_{A1}$ | $2C_{A1} + C_{B1}$ | $4C_{A1}$ | $2C_{A1} + C_{B1}$ | $2C_{A1} + C_{B1}$ |

A description and reference marks of table 2 are the same as those of table 1, and a description thereof is thus omitted. Referring to table 1 and table 2, pixels, which have the same pixel color, from among the pixels connected with the same data line (e.g., the first data line DL1) may be activated adjacent to each other by non-sequentially activating gate lines. As such, it may be possible to reduce power consumed to charge a line cap (e.g., the first line cap Cm).

For example, in the embodiment of FIG. 5A, pixels are activated in an order of RD11→BL21→BL41→RD31 only in consideration of pixels connected with the first data line DL1. In this case, when the "BL" pixel displays a color (i.e., blue), power consumed to charge the first line cap $C_{B1}$ may be reduced compared with the embodiment of FIG. 4. That is, consumed power (i.e., power consumed to charge the line cap CB1) may be reduced by non-sequentially activating gate lines such that pixels, which have the same pixel color, from among pixels connected with the same data line are activated to be continuous or adjacent to each other. In more generic terms, as shown in FIG. 5, while the controller 150 is configured to control the gate driver 120 and generate the switch control signals such that the data lines are activated in a same order each time one of the gate lines is activated, the controller 150 is configured to control the gate driver 120 and generate the switch control signals such that the gate lines are activated non-sequentially, and an order of pixels activated and associated with a same one of the data lines includes at least two pixels of a same color activated in sequence.

Figure 5B:
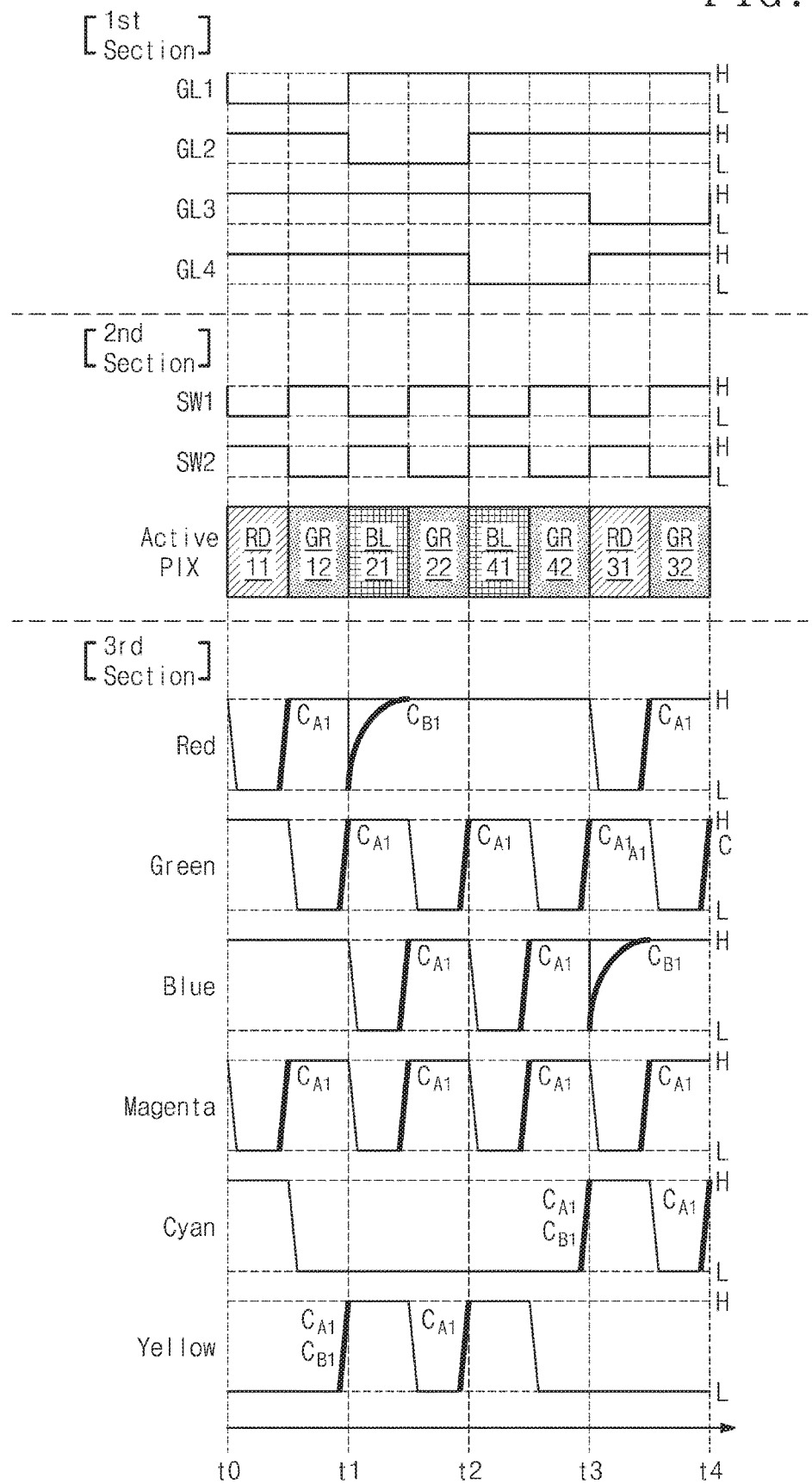

In example embodiments, unlike the embodiment of FIG. 5A, an example embodiment of FIG. 5B shows that periods for transition of activated gate lines is omitted. For example, in FIG. 5A, the second gate line GL2 may be activated, after predetermined time lapses when the first gate line GL1 has been deactivated. However, according to the example embodiment of FIG. 5B, the second gate line GL2 may be activated, directly after the first gate line GL1 is deactivated. That is, according to the example embodiment of FIG. 5B, the plurality of gate lines are activated in an order of GL1→GL2→GL4→GL3, consecutively (or, without intermediate time or delay time or null function period, etc.). In example embodiments, in each of activation periods of gate lines, the first and second switch signals SW1 and SW2 may be activated in a manner that is similar to a manner to be described with reference to FIG. 5A. In the example embodiments of FIG. 5B, as an operation method except the matter is similar to FIG. 5A, the description thereof is omitted.

Figure 6A:
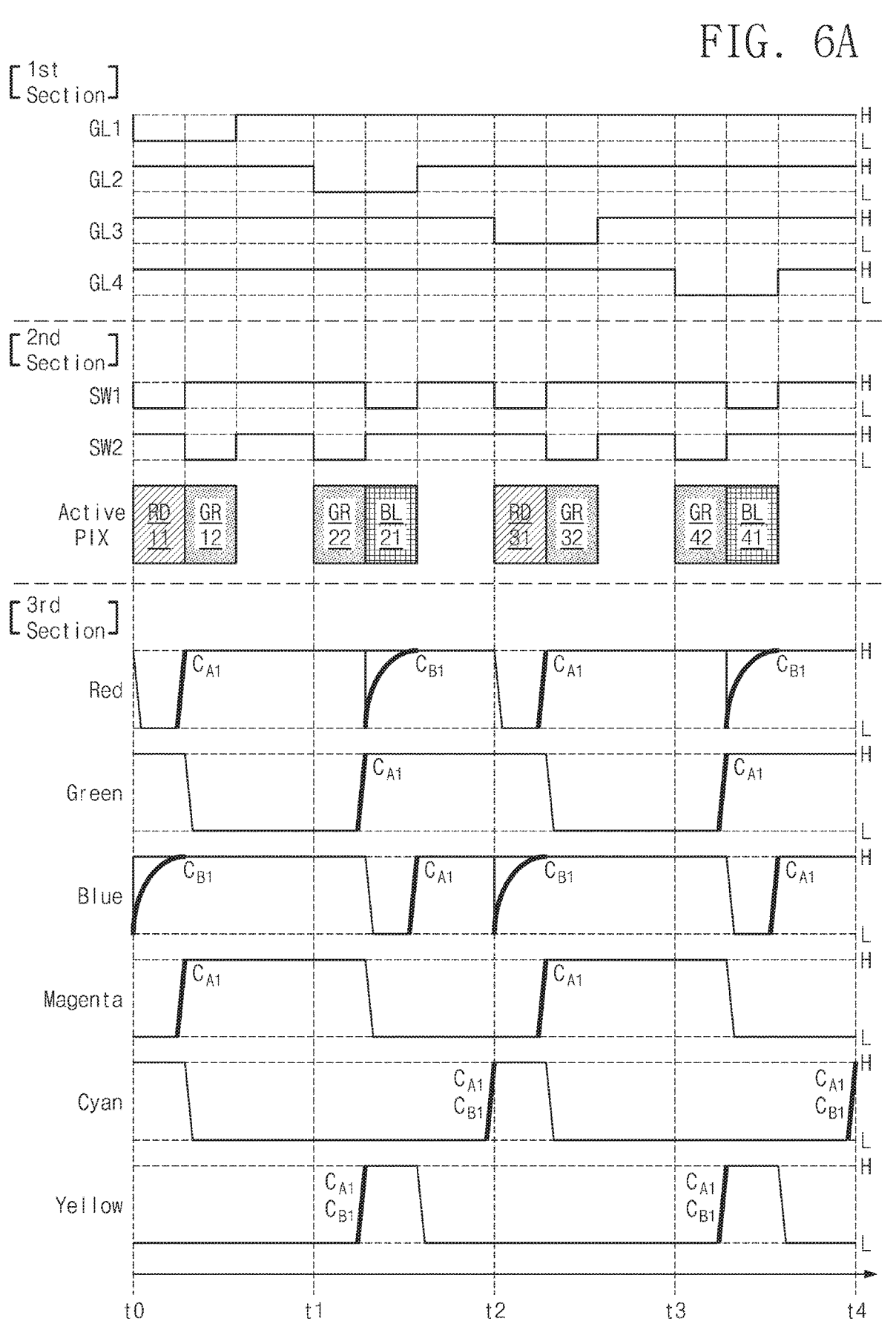

Referring to FIGS. 1, 3, and 6A, as illustrated in a first section of FIG. 6A, the gate driver 120 may sequentially activate the first to fourth gate lines GL1 to GL4. As illustrated in a second section of FIG. 6A, the first and second switch signals SW1 and SW2 may be non-sequentially activated while the first to fourth gate lines GL1 to GL4 are sequentially activated.

In an embodiment, that the first and second switch signals SW1 and SW2 are non-sequentially activated means that the first and second switch signals SW1 and SW2 are activated in any order, not in a cyclic or alternating order. For example, the first and second switch signals SW1 and SW2 illustrated in FIG. 4 may be activated according to the cyclic order.

However, according to the embodiment illustrated in FIG. 6A, in an active period of the first gate line GL1, the second switch signal SW2 may be activated after the first switch signal SW1 is activated. In an active period of the second gate line GL2, the first switch signal SW1 may be activated after the second switch signal SW2 is activated. In an active period of the third gate line GL3, the second switch signal SW2 may be activated after the first switch signal SW1 is activated. In an active period of the fourth gate line GL4, the first switch signal SW1 may be activated after the second switch signal SW2 is activated. That is, when the first to fourth gate lines GL1 to GL4 are sequentially activated, the first and second switch signals SW1 and SW2 may be activated in an order of [SW1→SW2]→[SW2→SW1]→ [SW1→SW2]→[SW2→SW1] (i.e., non-sequentially).

In this case, pixels may be activated in an order of RD11→GR12→GR22→BL21→RD31→GR32→GR42→ BL41. As in the description given with reference to FIGS. 4 and 5, the first source driving unit SD1 may be configured to provide a data signal to a pixel to display various colors. With regard to each display color, a period in which the driving cap $C_{A1}$ and the first line cap $C_{B1}$ are charged is marked with a bold solid line in a third section of FIG. 6A. With regard to each display color, a configuration of the source driver part SD1 for providing a data signal, and a configuration for charging the driving cap $C_{A1}$ and the first line cap $C_{B1}$ are similar to those of the embodiments of FIGS. 4 and 5 except for an order in which pixels are activated, and a detailed description thereof is thus omitted. The following table 3 shows power consumed to display each display color in the embodiment of FIG. 6A.

TABLE 3

| Display colors | Red | Green | Blue | Magenta | Cyan | Yellow |
|---|---|---|---|---|---|---|
| Display pixels RD/GR/BL/GR | L/H/H/H | H/L/H/L | H/H/L/H | L/H/L/H | H/L/L/L | L/L/H/L |
| Consumed power | $2C_{A1} + 2C_{B1}$ | $2C_{A1}$ | $2C_{A1} + 2C_{B1}$ | $2C_{A1}$ | $2C_{A1} + 2C_{B1}$ | $2C_{A1} + 2C_{B1}$ |

A description and reference marks of table 3 are the same as those of table 1, and a description thereof is thus omitted.

Compared with the embodiments of FIGS. 4 and 5, in the embodiment of FIG. 6A, "GR" pixels may be continuously activated. For example, the "GR12" pixel and the "GR22" pixel are continuously activated, and the "GR32" pixel and the "GR42" pixel are continuously activated. In this case, power consumed for the "GR" pixel to display a color (in other words, power consumed to charge the driving cap $C_{A1}$) may be reduced.

That is, referring to table 3 and FIG. 6A, the switch signals SW1 and SW2 may be non-sequentially activated such that pixels having the same pixel color are continuously activated. As such, it may be possible to reduce power consumed to charge the driving cap CA1. Stated more generically, as shown in FIG. 6A, while the controller 150 is configured to control the gate driver 120 such that the plurality of gate lines are sequentially activated, the controller 150 is configured to control the gate driver 120 and generate the switch control signals such that the data lines are activated in a first order for a currently activated gate line of the gate lines, and are activated in a second order for a subsequently activated gate line of the gate lines (the second order being different from the first order), and an order of pixels activated and associated with a same one of the plurality of data lines includes at least two pixels of a same color activated in sequence. As shown in FIG. 6A, in one embodiment, the controller 150 is configured to generate the switch control signals such that at least one of the data lines is consecutively activated. As further shown in FIG. 6A, in one embodiment, the controller 150 is configured to generate the switch control signals such that after a first data line is activated more than one time, the first data line is not activated again until a second data line is activated more than one time.

Figure 6B:
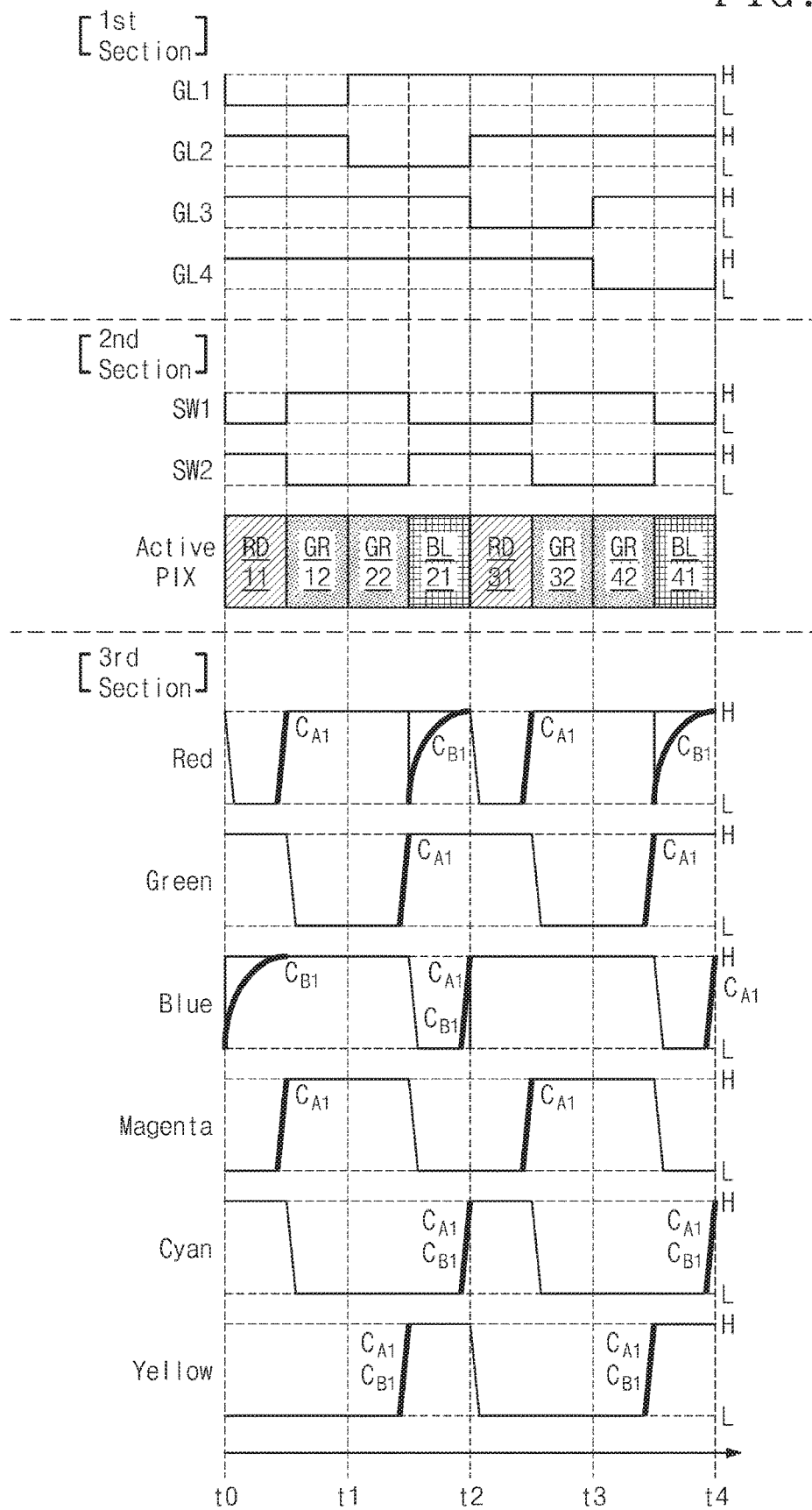

In example embodiments, unlike the embodiment of FIG. 6A, an example embodiment of FIG. 6B shows that periods for transition of activated gate lines is omitted. For example, in FIG. 6A, the second gate line GL2 may be activated, after predetermined time lapses when the first gate line GL1 has been deactivated. However, according to the example embodiment of FIG. 6B, the second gate line GL2 may be activated, directly after the first gate line GL1 is deactivated. That is, according to the example embodiment of FIG. 6B, the plurality of gate lines are activated in an order of GL1→GL2→GL3→GL4, consecutively (or, without intermediate time or delay time or null function period, etc.). In example embodiments, in each of activation periods of gate lines, the first and second switch signals SW1 and SW2 may be activated in a manner that is similar to a manner to be described with reference to FIG. 6A. In the example embodiments of FIG. 6B, as an operation method except the matter is similar to FIG. 6A, the description thereof is omitted.

Figure 7A:
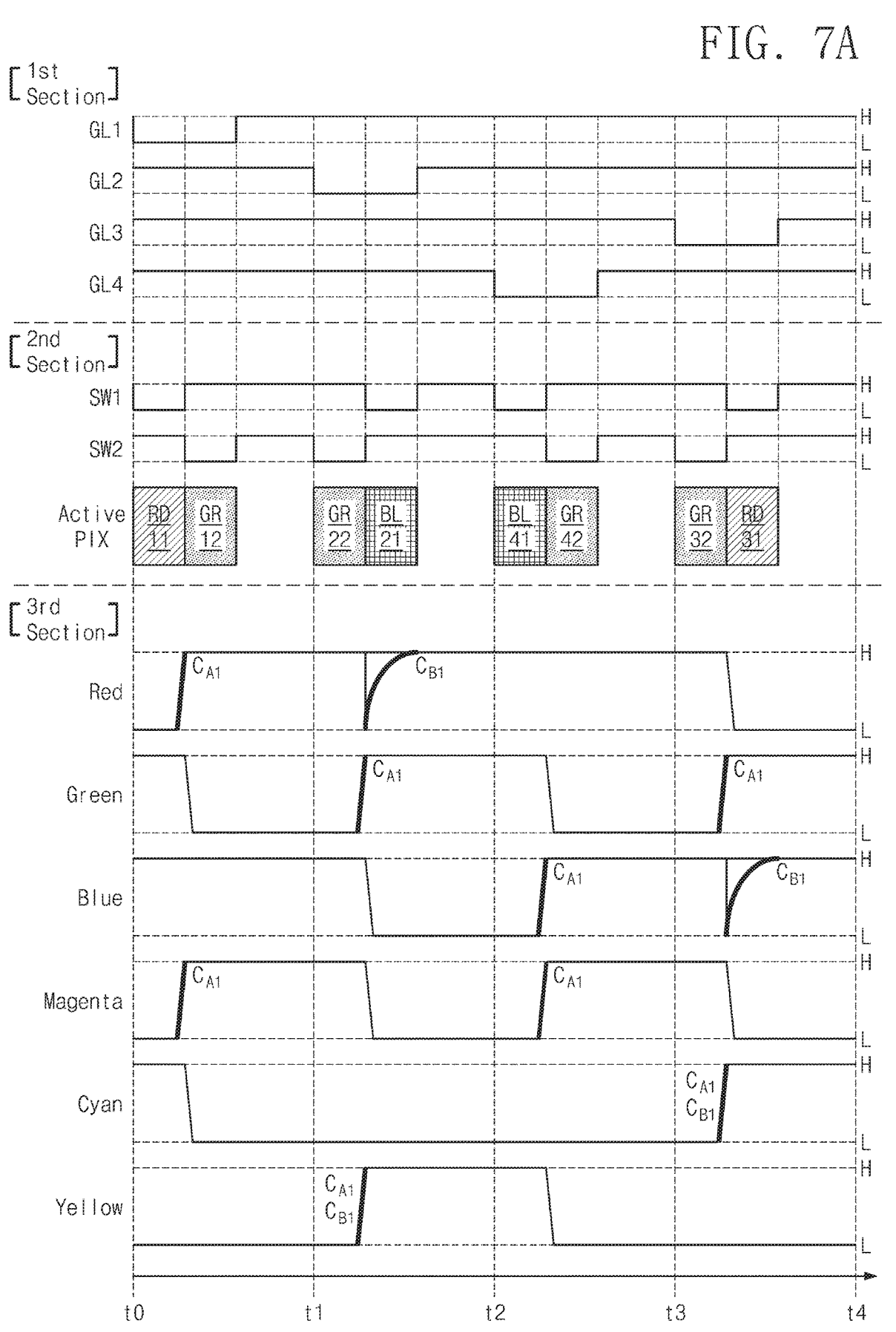

Referring to FIGS. 1, 3, and 7A, as illustrated in a first section of FIG. 7, the gate driver 120 may non-sequentially activate the first to fourth gate lines GL to GL4. For example, as in the description given with reference to FIG. 5, the gate driver 120 may non-sequentially activate gate lines in an order of GL1→GL2→GL4→GL3.

As illustrated in a second section of FIG. 7A, the first and second switch signals SW1 and SW2 may be non-sequentially activated such that the first to fourth gate lines GL to GL4 are non-sequentially activated. For example, in an active period of the first gate line GL1, the second switch signal SW2 may be activated after the first switch signal SW1 is activated. In an active period of the second gate line GL2, the first switch signal SW1 may be activated after the second switch signal SW2 is activated. In an active period of the fourth gate line GL4, the second switch signal SW2 may be activated after the first switch signal SW1 is activated. In an active period of the third gate line GL3, the first switch signal SW1 may be activated after the second switch signal SW2 is activated.

That is, as in the description given with reference to FIG. 6A, the first and second switch signals SW1 and SW2 may be activated in an order of [SW1→SW2]→[SW2→SW1]→[SW1→SW2]→[SW2→SW1]. In this case, pixels may be activated in an order of RD11→GR12→GR22→BL21→BL41→GR42→GR32→RD31.

In a third section of FIG. 7A, an operation of the first source driving unit SD1 will be described with reference to the event that image information of a red color is displayed. In an active period of the "RD11" pixel, the first data line DL1 and the first terminal TM1 are connected to each other, and the first source driving unit SD1 may provide a data signal of the low level "L" to the first terminal TM1 such that the "RD11" pixel emits light. In this case, the driving cap $C_{A1}$ and the first line cap $C_{B1}$ may be discharged to the low level "L".

Afterwards, in an active period of the "GR12" pixel, the second data line DL2 and the first terminal TM1 are connected to each other, and the first source driving unit SD1 may provide a data signal of the high level "H" to the first terminal TM1 such that the "GR12" pixel does not emit light. In this case, since the driving cap $C_{A1}$ is at a low-level state, the first source driving unit SD1 may consume power for charging the driving cap $C_{A1}$ to the high level "H".

Afterwards, in an active period of the "GR22" pixel, the second data line DL2 and the first terminal TM1 are connected to each other, and the first source driving unit SD1 may provide a data signal of the high level "H" to the first terminal TM1 such that the "GR22" pixel does not emit light. In this case, since the driving cap $C_{A1}$ and the second line cap $C_{B2}$ are already at a high-level state, charging power may not be separately consumed.

Afterwards, in an active period of the "BL21" pixel, the first data line DL1 and the first terminal TM1 are connected to each other, and the first source driving unit SD1 may provide a data signal of the high level "H" to the first terminal TM1 such that the "BL21" pixel does not emit light. In this case, since the first line cap $C_{B1}$ is discharged to the low level "L" in the active period of the "RD11" pixel, power is consumed to charge the first line cap $C_{B1}$ to the high level "H".

Afterwards, in active periods of the "BL41", "GR42", and "GR32" pixels, the first source driving unit SD1 provides a data signal of the high level "H" to the first terminal TM1 such that the "BL41", "GR42", and "GR32" pixels do not emit light. In this case, since the driving cap $C_{A1}$ and the first and second line caps $C_{B1}$ and $C_{B2}$ are already at a high-level state, charging power may not be separately consumed.

Afterwards, in an active period of the "RD31" pixel, the first data line DL1 and the first terminal TM1 are connected to each other, and the first source driving unit SD1 may provide a data signal of the low level "L" to the first terminal TM1 such that the "RD31" pixel emits light. In this case, the driving cap $C_{A1}$ and the first line cap $C_{B1}$ may be discharged to the low level "L".

As described above, according to the embodiment of FIG. 7A, in the case of displaying image information of a red color, when the first to fourth gate lines GL1 to GL4 are non-sequentially activated, power consumed to charge the driving cap $C_{A1}$ and the first and second line caps $C_{B1}$ and $C_{B2}$ may be "$C_{A1}+C_{B1}$". That is, power consumption may be reduced by non-sequentially activating gate lines and switch signals.

As in the above description, power may be consumed to charge the driving cap $C_{A1}$ based on a pixel color (or a data signal) associated with an immediately previously activated pixel, and power may be consumed to charge the first and second line caps $C_{B1}$ and $C_{B2}$ based on a pixel color (or a data signal) associated with a pixel, which is activated lastly, from among pixels connected with the same data line. The following table 4 shows power consumed to display each display color in the embodiment of FIG. 7A.

TABLE 4

| Display colors | Red | Green | Blue | Magenta | Cyan | Yellow |
|---|---|---|---|---|---|---|
| Display pixels RD/GR/BL/GR | L/H/H/H | H/L/H/L | H/H/L/H | L/H/L/H | H/L/L/L | L/L/H/L |
| Consumed power | $CA_1 + C_{B1}$ | $2C_{A1}$ | $C_{A1} + C_{B1}$ | $2C_{A1}$ | $C_{A1} + C_{B1}$ | $C_{A1} + C_{B1}$ |

A description and reference marks of table 4 are the same as those of table 1, and a description thereof is thus omitted.

Referring to table 1 to table 4, according to the embodiment of FIG. 7A, power consumed to display image information of each color is reduced compared with the embodiments described with reference to FIGS. 4 to 6. That is, since gate lines and switch signals are non-sequentially controlled, pixels that have the same pixel color and are connected with the same data line may be continuously activated, and thus, power consumption may be reduced.

That is, according to an embodiment of the inventive concepts, the display device 100 may be configured to non-sequentially control gate lines and switch signals such that a pixel (i.e., a current pixel) having the same pixel color as the last pixel is activated. In this case, the last pixel indicates a pixel, which is activated lastly, from among pixels connected with an immediately previously activated gate line. The current pixel may indicate a pixel that has the same pixel color as the last pixel and is connected with the same data line. As such, power consumed to charge the driving cap CA1 and the line caps CB1 and CB2 may be reduced by non-sequentially activating gate lines and switch signals. As shown in FIG. 7A, the controller 150 is configured to control the gate driver 120 and generate the switch control signals such that the gate lines are activated non-sequentially, the data lines are activated in a first order for a currently activated gate line of the plurality of gate lines and are activated in a second order for a subsequently activated gate line of the plurality of gate lines (the second order being different from the first order), and an order of pixels activated and associated with a first same one of the plurality of data lines includes a first group of at least two pixels of a first same color activated in sequence. As shown in FIG. 7, the controller 150 is configured to control the gate driver 120 and generate the switch control signals such that an order of pixels activated and associated with a second same one of the data lines includes a second group of at least two pixels of a second same color activated in sequence. For example, the second group of at least two pixels are consecutively activated. Also, the first same color and the second same color are different colors. As further shown in FIG. 7A, the controller 150 is configured to generate the switch control signals such that after a one data line is activated more than one time, that data line is not activated again until another data line is consecutively activated more than one time.

Figure 7B:
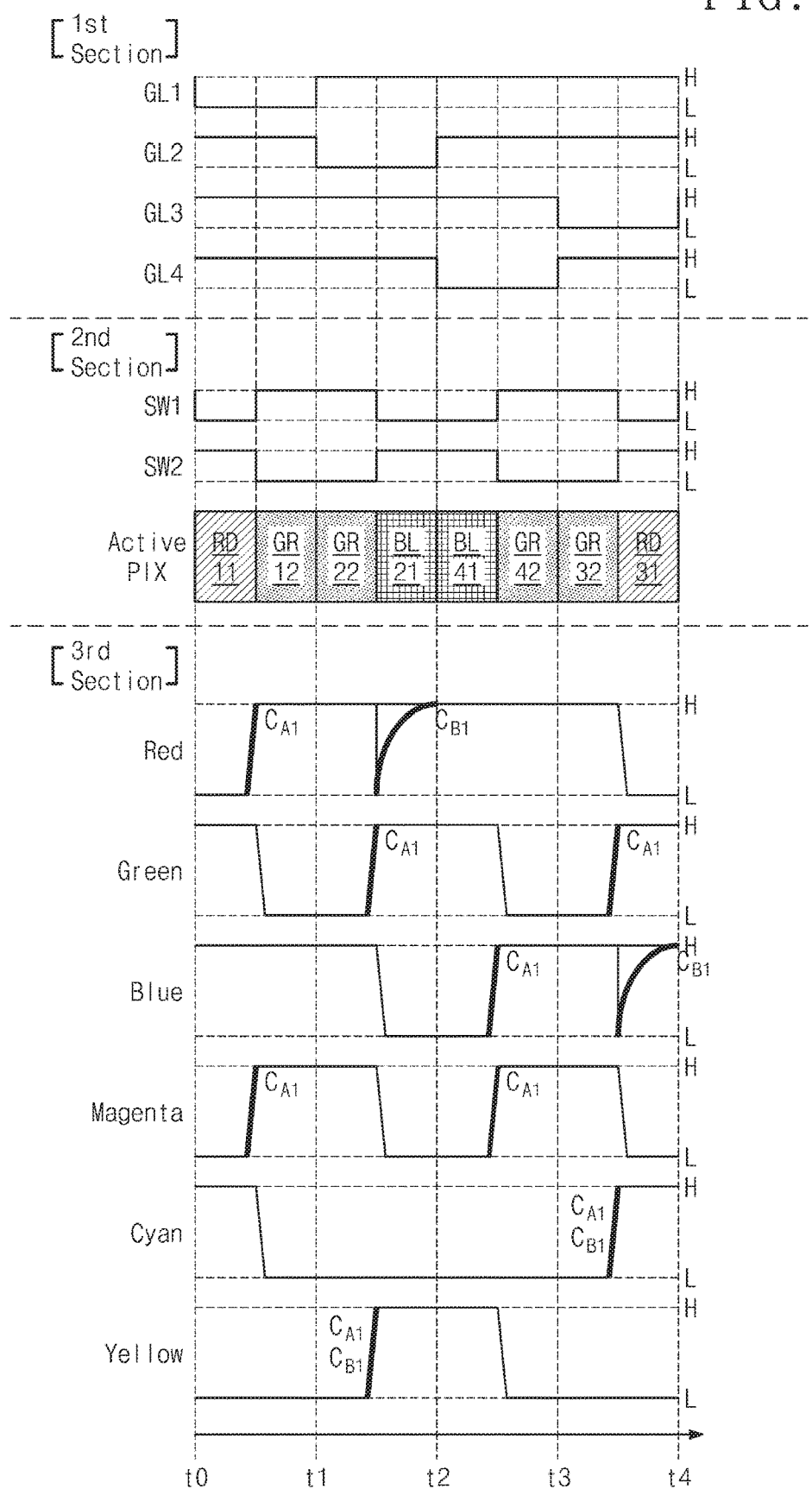

In example embodiments, unlike the embodiment of FIG. 7A, an example embodiment of FIG. 7B shows that periods for transition of activated gate lines is omitted. For example, in FIG. 7A, the second gate line GL2 may be activated, after predetermined time lapses when the first gate line GL1 has been deactivated. However, according to the example embodiment of FIG. 7B, the second gate line GL2 may be activated, directly after the first gate line GL1 is deactivated. That is, according to the example embodiment of FIG. 7B, the plurality of gate lines are activated in an order of GL1→GL2→GL4→GL3, consecutively (or, without intermediate time or delay time or null function period, etc.). In example embodiments, in each of activation periods of gate lines, the first and second switch signals SW1 and SW2 may be activated in a manner that is similar to a manner to be described with reference to FIG. 7A. In the example embodiments of FIG. 7B, as an operation method except the matter is similar to FIG. 7A, the description thereof is omitted.

Figure 8A:
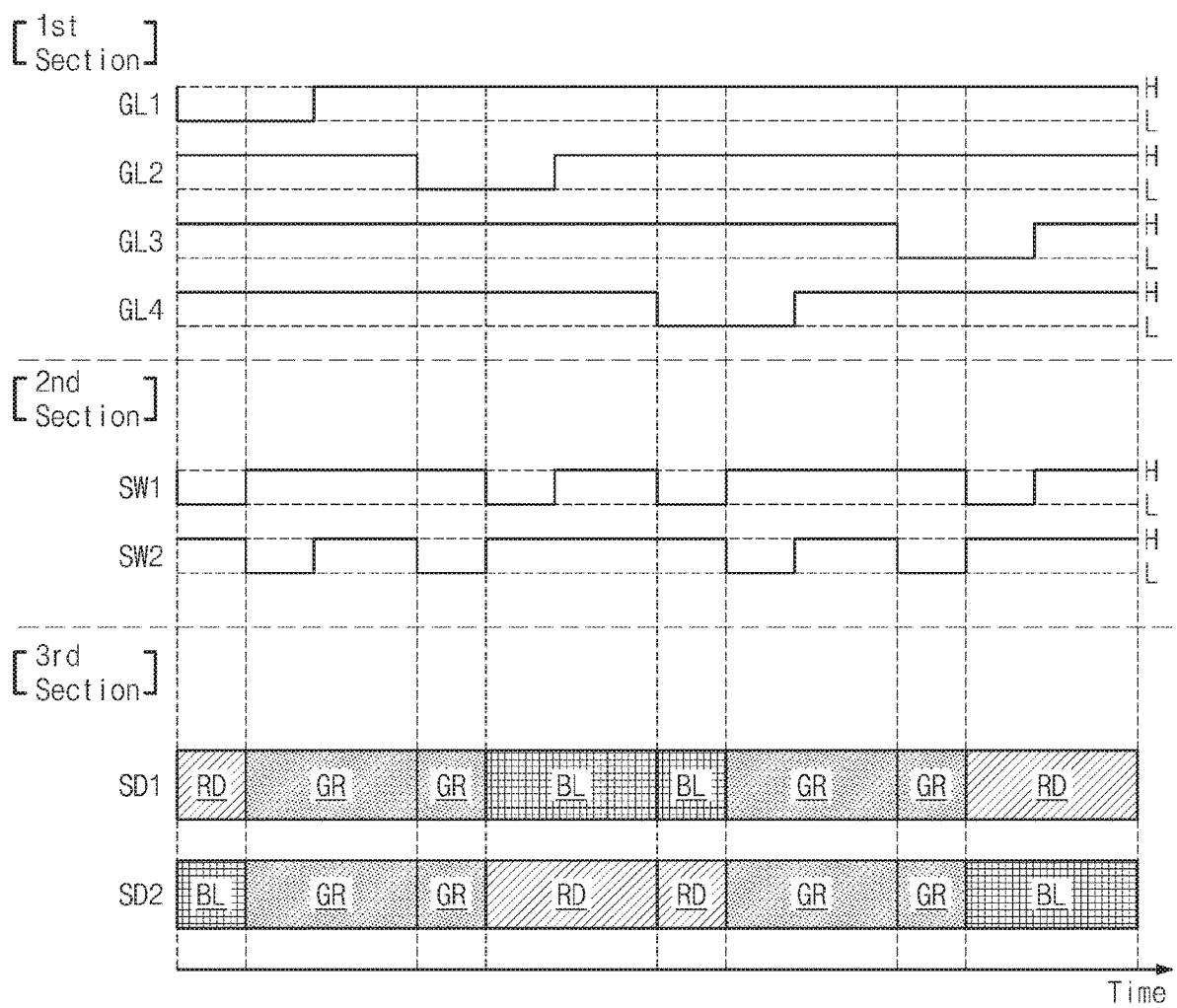
FIGS. 8A and 8B are timing diagrams illustrating an operation of source driving units of FIG. 3.
Figure 8B:
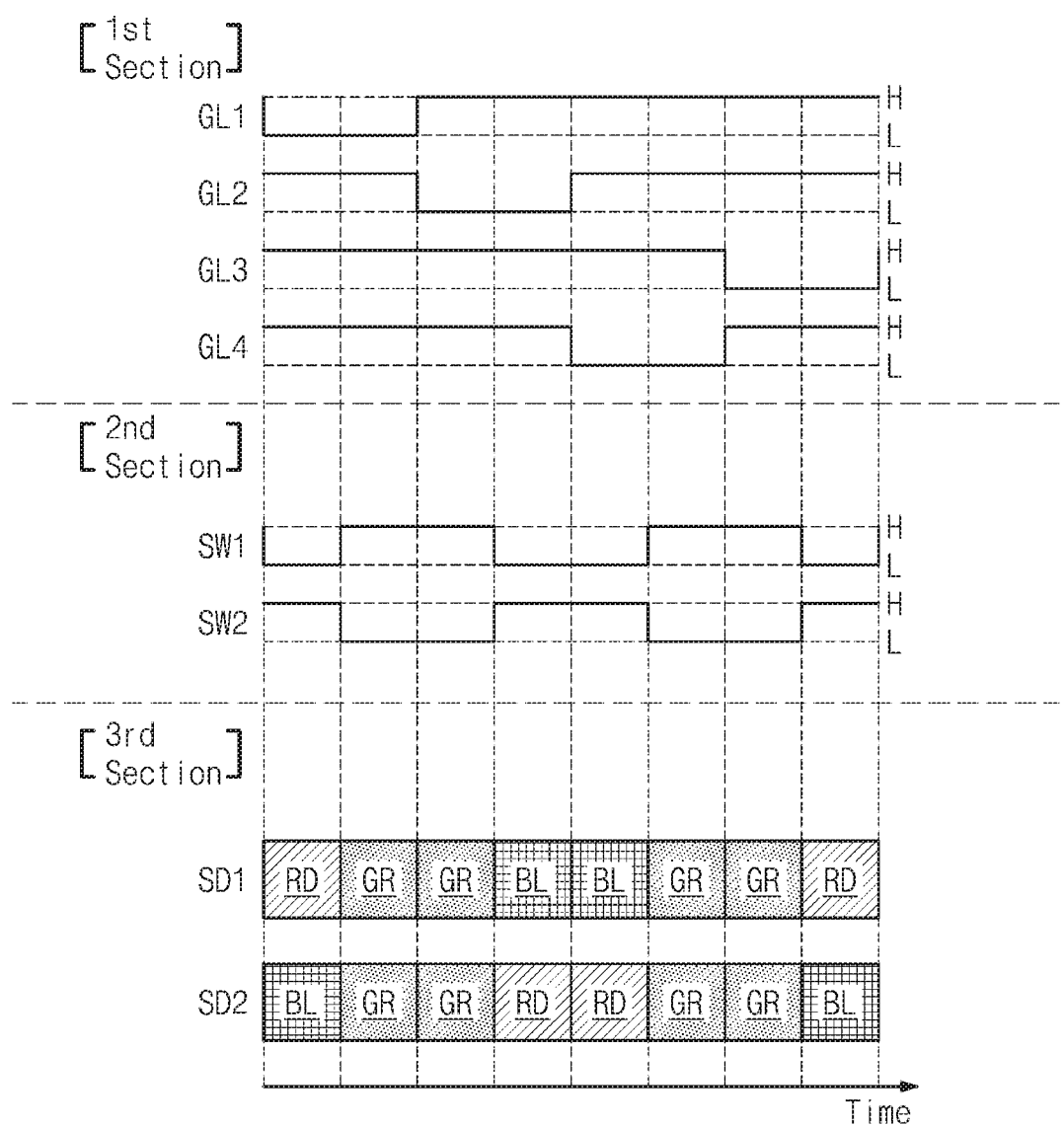

FIGS. 8A and 8B are timing diagrams illustrating an operation of source driving units of FIG. 3. Power consumption due to a change in a gamma voltage of the first and second source driving units SD1 and SD2 will be described with reference to FIGS. 8A and 8B. In FIGS. 8A and 8B, a horizontal axis represents a time. In FIGS. 8A and 8B, a first section indicates voltage levels or gate signals of the first to fourth gate lines GL1 to GL4, a second section indicates voltage levels of the first and second switch signals SW1 and SW2, and a third section indicates data signals provided by the first and second source driving units SD1 and SD2 and types (i.e., red RD, green GR, or blue BL) of the corresponding gamma voltages.

In an embodiment, each of the first and second source driving units SD1 and SD2 of FIG. 3 may be configured to receive a gamma voltage from a gamma generation unit (not illustrated) and provide a data signal by using the received gamma voltage. In this case, the gamma voltage may change with a pixel color of an active pixel. If a gamma voltage is changed according to a pixel color of an active pixel, analog power may be consumed by the source driver 140. That is, power consumption due to a change in a gamma voltage may increases as pixel colors of active pixels are frequently changed.

Likewise, FIG. 8A shows that there is a predetermined time between activation periods of gate lines, and FIG. 8B shows that gate lines are activated, consecutively (or, without intermediate time or delay time or null function period, etc.). Since these embodiments are described above, and thus detailed descriptions thereof are omitted. For an ease of the description, example embodiments of this inventive concepts will be described with reference to FIG. 8A.

Referring to FIGS. 1, 3, and 8A, as illustrated in a first section of FIG. 8A, the gate driver 120 may non-sequentially activate the first to fourth gate lines GL1 to GL4. As illustrated in a second section of FIG. 8A, the first and second switch signals SW1 and SW2 may be non-sequentially activated. An order in which the first to fourth gate lines GL1 to GL4 and the first and second switch signals SW1 and SW2 are activated is the same as that of the embodiment described with reference to FIG. 7A, and a detailed description thereof is thus omitted.

As illustrated in a third section of FIG. 8A, each of the first and second source driving units SD1 and SD2 may be configured to provide a data signal corresponding to a pixel color of an active pixel in an order in which the first to fourth gate lines GL1 to GL4 and the first and second switch signals SW1 and SW2 are activated.

For example, in an active period of the first gate line GL1 and the first switch signal SW1, the first source driving unit SD1 outputs a data signal by using a gamma voltage corresponding to a red (RD) color, and the second source driving unit SD2 outputs a data signal by using a gamma voltage corresponding to a blue (BL) color. Afterwards, in an active period of the first gate line GL1 and the second switch signal SW2, each of the first and second source driving units SD1 and SD2 outputs a data signal by using a gamma voltage corresponding to a green (GR) color.

As in the above description, the first source driving unit SD1 outputs a data signal by using a gamma voltage corresponding to each color in an order of GR→BL-→BL→GR→GR→RD, based on an order in which the second to fourth gate lines GL2 to GL4 and the first and second switch signals SW1 and SW2 are activated. The second source driving unit SD2 outputs a data signal by using a gamma voltage corresponding to each color in an order of GR→RD→RD→GR→GR→BL, based on an order in which the second to fourth gate lines GL2 to GL4 and the first and second switch signals SW1 and SW2 are activated.

As described above, since the first to fourth gate lines GL1 to GL4 and the first and second switch signals SW1 and SW2 are non-sequentially activated such that a pixel having the same pixel color as a pixel color of an immediately previously activated pixel is activated, the number of times that gamma voltages used in the first and second source driving units SD1 and SD2 are changed may be reduced.

As a more detailed example, although not illustrated in drawings, according to an order in which gate lines and switch signals are activated (refer to FIG. 4A), the first source driving unit SD1 may output a data signal by using a gamma voltage corresponding to each color in an order of RD→GR→BL→GR→RD→GR→BL→GR. In this case, the number of times that a gamma voltage is changed according to a change in a pixel color of an active pixel may be "7".

However, according to the embodiment illustrated in FIG. 8, the first source driving unit SD1 may output a data signal by using a gamma voltage corresponding to each color in an order of RD→GR→GR→BL→BL→GR→GR→RD. In this case, the number of times that a gamma voltage is changed according to a change in a pixel color of an active pixel may be "4". That is, the number of times that a gamma voltage is changed according to a change in a pixel color may be reduced by non-sequentially activating the first to fourth gate lines GL1 to GL4 and the first and second switch signals SW1 and SW2. Accordingly, power consumption due to a change in a gamma voltage may be reduced.

Figure 9:
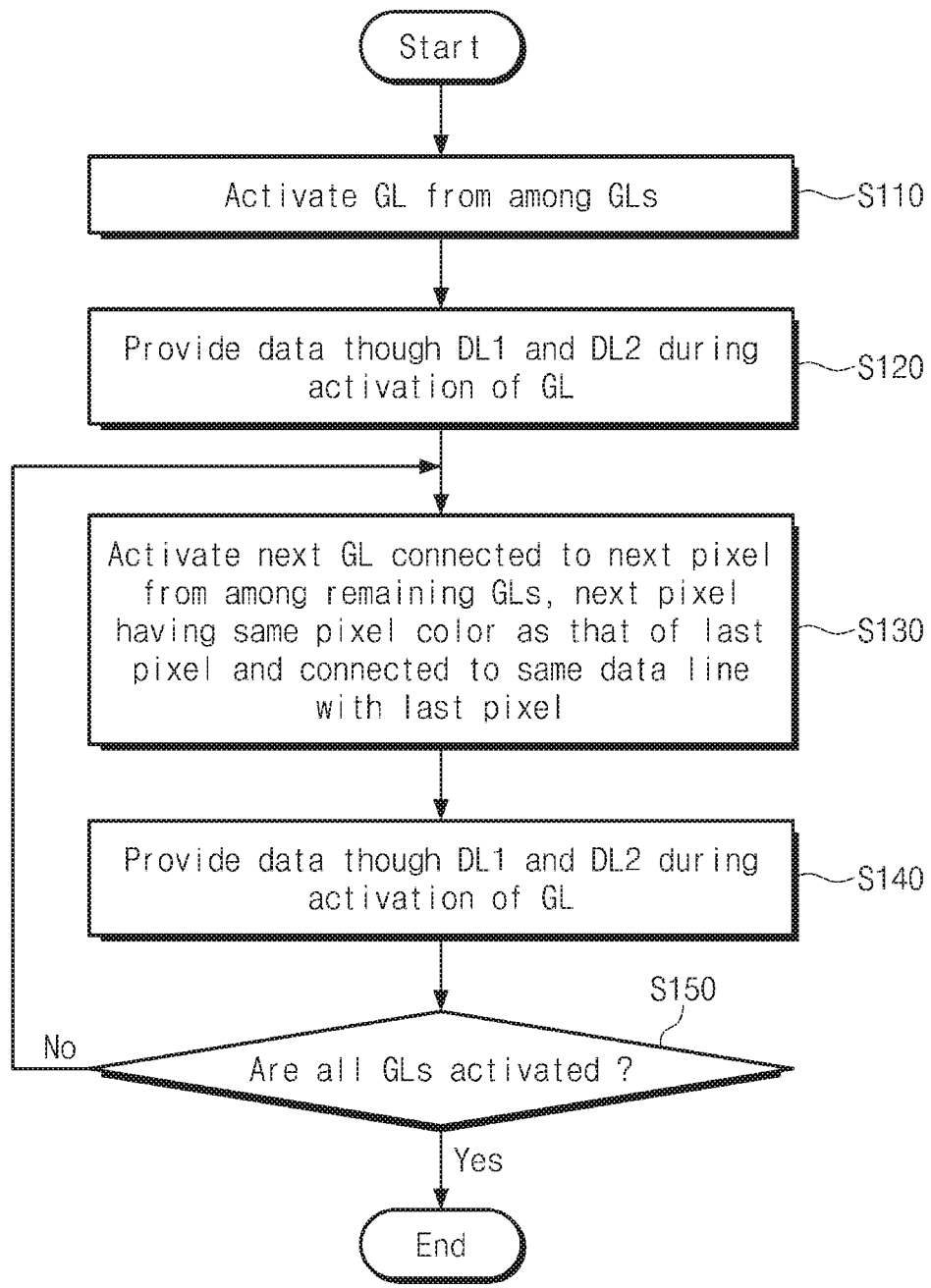
FIG. 9 is a flowchart illustrating an operating method of the display device of FIG. 3.

FIG. 9 is a flowchart illustrating an operating method of a display device of FIG. 3. For a brief description, an operating method of the display device 100 will be described with reference to a configuration of one source driving unit SD1 and two data lines DL1 and DL2. Also, for a brief description, an operating method in which the display device 100 displays one frame will be described. However, embodiments of the present invention may not be limited thereto. For example, it may be well understood that expansion to a plurality of data lines and a plurality of driving units is possible.

Referring to FIGS. 3 and 9, in operation S110, the display device 100 may activate one of a plurality of gate lines GL. For example, as described above, the gate driver 120 may activate one of a plurality of gate lines.

In operation S120, the display device 100 may provide data signals through the first and second data lines DL1 and DL2 in an active period of a gate line. For example, in the case where the activated gate line is the first gate line GL1, the first source driving unit SD1 may provide a data signal to the "RD11" pixel through the first data line DL1 and may then provide a data signal to the "GR12" pixel through the second data line DL2. In this case, the first and second switch signals SW1 and SW2 may be activated such that the corresponding data signals are provided in an order of the "RD11" pixel and the "GR12" pixel.

In operation S130, the display device 100 may activate a next gate line, which is connected with a next pixel, from among the remaining gate lines. In this case, the next pixel has the same pixel color as the last pixel and is connected to the same data line as the last pixel. The last pixel may be a pixel that is lastly activated in an active period of an immediately previously activated gate line.

For example, as described in operation S120, when the first gate line GL1 is activated, the "RD11" pixel may be activated; afterwards, the "GR12" pixel may be activated. In this case, the "GR12" pixel may be the lastly activated pixel (i.e., the last pixel). Here, the next pixel may be the "GR22" pixel that has the same pixel color (i.e., green) as the last pixel (i.e., the "GR12" pixel) and is connected to the same data line (i.e., the second data line DL2). The gate driver 120 of the display device 100 may activate a next gate line (i.e., the second gate line GL2) connected with the next pixel (i.e., the "GR22" pixel).

In operation S140, the display device 100 may provide data signals through the first and second data lines DL1 and DL2 in an active period of the next gate line such that the data signal is first provided to the next pixel.

For example, as described in operation S130, the next pixel may be the "GR22" pixel. In this case, in an active period of the next gate line (i.e., the second gate line GL2), since the second switch signal SW2 is first activated, a data signal may be first provided to the next pixel (i.e., the "GR22" pixel). Afterwards, when the first switch signal SW1 is activated, the data signal may be provided to the "BL21" pixel.

In operation S150, the display device 100 may determine whether all gate lines are activated. If all gate lines are not activated (i.e., if a gate line that is not activated exists), the display device 100 may repeat operation S130 and operation S140.

For example, returning to operation S130, the display device 100 may activate a next gate line among remaining gate lines. In this case, as described above, the next gate line is connected with a next pixel, and the next pixel is connected with the same data line as the last pixel and has the same pixel color as the last pixel.

As a more detailed example, the last pixel in an active period of the second gate line GL2 may be the "BL21" pixel. Here, the next pixel may be the "BL41" pixel that has the same pixel color (i.e., blue) as the "BL21" pixel and is connected with the same data line (i.e., the first data line DL1). As such, the display device 100 may activate a next gate line (i.e., the fourth gate line DL4) connected with the next pixel (i.e., the "BL41" pixel). Afterwards, in operation S140, the display device 100 may control the switch signals SW1 and SW2 such that a data signal is first provided to the next pixel (i.e., the "BL41" pixel).

If all gate lines are activated, the display device 100 may end a display operation associated with one frame. In an embodiment, the display device 100 may display a plurality of frames by repeating operation S110 to operation S150.

As described above, the display device 100 according to an embodiment of the inventive concepts may reduce power consumption due to a driving cap $C_A$ or a line cap $C_B$ of the display device 100 by activating a gate line connected with a current pixel that has the same pixel color as the last pixel and activating switch signals such that a data signal is first provided to a pixel having the same pixel color as the lastly activated pixel. In addition, power consumption due to a change in a gamma voltage may be reduced by activating gate lines and switch signals such that pixels having the same pixel color are activated to be continuous or adjacent to each other.

Figure 10:
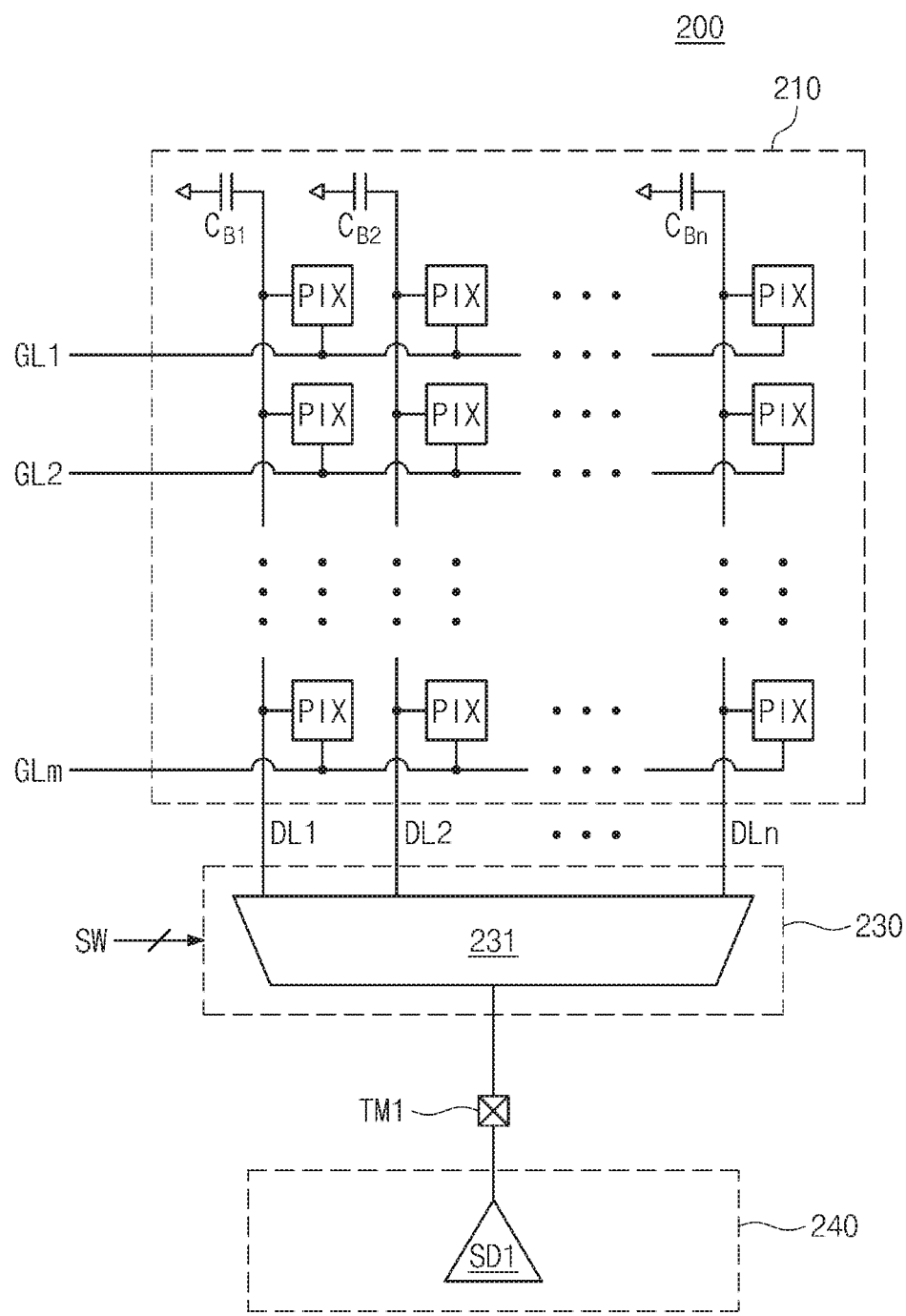
FIG. 10 is a block diagram illustrating a display device according to an embodiment of the inventive concepts.

FIG. 10 is a block diagram illustrating a display device according to an embodiment of the inventive concepts. For convenience of description and brevity of illustration, duplicated elements and descriptions thereof are omitted. Referring to FIG. 10, a display device 200 may include a pixel array 210, a switch driver 230, and a source driver 240. Although not illustrated in FIG. 10, the display device 200 may further include elements such as a gate driver and a controller.

A plurality of pixels PIX of the pixel array 210 are connected with a plurality of gate lines GL to GLm and a plurality of data lines DL1 to DLn. The pixel array 210 and the plurality of pixels PIX are described above, and thus a detailed description thereof is omitted.

Unlike the switch driver 130 (or a switch circuit) of FIGS. 1 to 9, the switch driver 230 includes a switch circuit 231 that is connected with the plurality of pixels PIX through a plurality of data lines DL1 to DLn and is configured to receive a data signal through the first terminal TM1 from a source driving unit SD1 of the source driver 240. The switch circuit 231 is configured to provide a signal received through the first terminal TM1 to one of the plurality of data lines DL1 to DLm in response to a switch signal SW. That is, switch circuit 231 may be implemented in the form of a 1:n demultiplexer (n being an integer greater 2).

Although not illustrated in FIG. 10, the switch driver 230 may further include a plurality of switch circuits implemented in the form of a 1:n demultiplexer, and the source driver 240 may further include a plurality of source driving units SD.

Figure 11A:
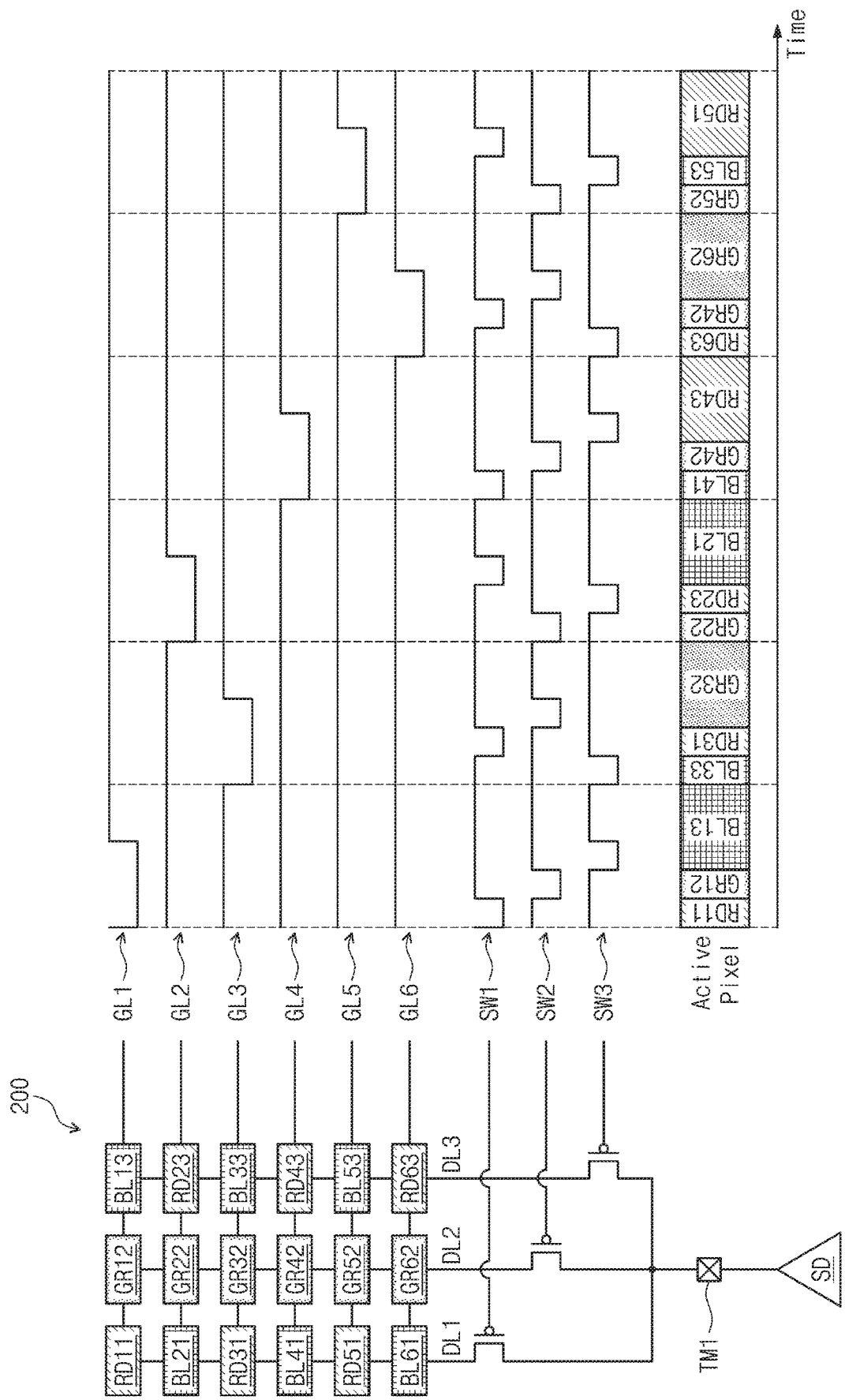
FIGS. 11A and 11B are diagrams for describing an operation of the display device of FIG. 10.
Figure 11B:
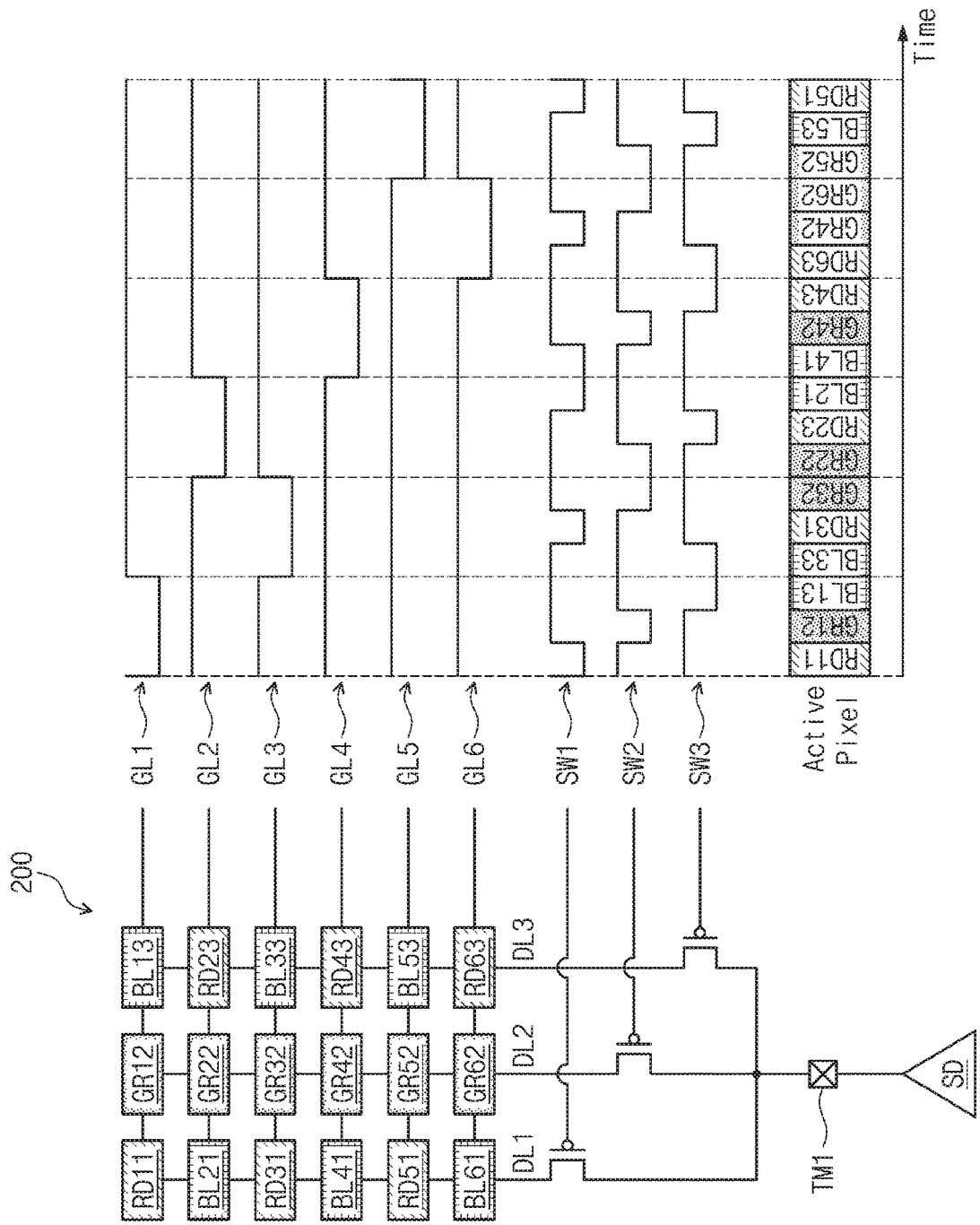

FIGS. 11A and 11B are diagrams for describing an operation of a display device of FIG. 10. For convenience of description, a detailed description of the above-described contents or configurations is omitted. Also, for brevity of illustration and convenience of description, an operating method of the display device 200 will be described with reference to pixels connected with first to sixth gate lines GL1 to GL6 and first to third data lines DL1 to DL3. Also, a reference mark RD, GR, or BL of the corresponding color filter is applied to each pixel.

Also, it is assumed that the switch circuit 231 is in the form of a 1:3 demultiplexer. That is, the switch circuit 231 is configured to provide a data signal from the source driving unit SD to one of the first to third data lines DL1 to DL3 in response to first to third switch signals SW1 to SW3. However, embodiments of the inventive concepts may not be limited thereto.

Likewise, FIG. 11A shows that there is a predetermined time between activation periods of gate lines, and FIG. 11B shows that gate lines are activated, consecutively (or, without intermediate time or delay time or null function period, etc.). Since these embodiments are described above, and thus detailed descriptions thereof are omitted. For an ease of the description, example embodiments of this inventive concepts will be described with reference to FIG. 11A.

Referring to FIG. 11A, the display device 200 may non-sequentially activate the first to sixth gate lines GL1 to GL6. For example, the display device 200 may non-sequentially activate gate lines in an order of GL1→GL3→GL2→GL4→GL6→GL5.

The display device 200 may non-sequentially activate the first to third switch signals SW1 to SW3 in active periods of the first to sixth gate lines GL1 to GL6. For example, the display device 200 may activate the first to third switch signals SW1 to SW3 in an order of [SW1→SW2→SW3]→[SW3→SW1→SW2]→[SW2→SW3→SW1]→[SW1→SW2→SW3]→[SW3→SW1→SW2]→[SW2→SW3→SW1], in the active periods of the first to sixth gate lines GL1 to GL6.

In this case, as described above, an order in which the first to sixth gate lines GL1 to GL6 are activated may be determined such that there is activated a gate line connected with a pixel that is connected to the same data line as the last active pixel and has the same pixel color as the last active pixel. For example, in the active period of the first gate line GL1, the last active pixel is a "BL13" pixel connected with the third data line DL3. In this case, there is activated the third gate line GL3 connected with a "BL33" pixel that is connected with the third data line DL3 and has the same pixel color as the last active pixel (i.e., "BL13" pixel). Likewise, in the active period of the third gate line GL3, the last active pixel is a "GR32" pixel connected with the second data line DL2. In this case, there is activated the second gate line GL2 connected with a "GR22" pixel that is connected with the second data line DL2 and has the same pixel color as the last active pixel (i.e., "GR32" pixel).

According to the above-described manner, the display device 200 may activate the first to sixth gate lines GL1 to GL6 such that there is activated a gate line connected with a pixel that is connected with the same data line as the last active pixel and has the same pixel color as the last active pixel.

As described above, an order in which the first to third switch signals SW1 to SW3 are activated may be determined such that a data signal is provided to a pixel having the same pixel color as an immediately previously activated last pixel. For example, in the active period of the first gate line GL1, the last active pixel is the "BL13" pixel. As such, in the active period of the third gate line GL3, the third switch signal SW3 may be first activated such that a data signal is first provided to the "BL33" pixel having the same pixel color (i.e., blue). Likewise, in the active period of the second gate line GL2, the second switch signal SW2 may be first activated such that a data signal is first provided to the "GR22" pixel having the same pixel color (i.e., green) as the previous last pixel (i.e., the "GR32" pixel).

According to the above-described order in which the first to sixth gate lines GL to GL6 and the first to third switch signals SW1 to SW3 are activated, pixels may be activated in an order of [RD11→GR12→BL13]→[BL33→RD31→GR32]→[GR22→RD23→BL21]→[BL41→GR42→RD43]→[RD63→BL61→GR62]→[GR52→BL53→RD51]. In this case, as described above, since pixels connected with the same data line and having the same pixel color are activated adjacent to each other, power consumed to charge a driving cap and line caps and power consumption due to a change in a gamma voltage are reduced.

FIGS. 12A to 12D are diagrams illustrating arrangement of pixels or arrangement of color filters, according to an embodiment of the inventive concepts. For brevity of illustration, elements which are unnecessary to describe the arrangement of pixels are omitted. Also, for convenience of description, a detailed description is omitted with regard to the arrangement of pixels illustrated in drawings.

Figure 12A:
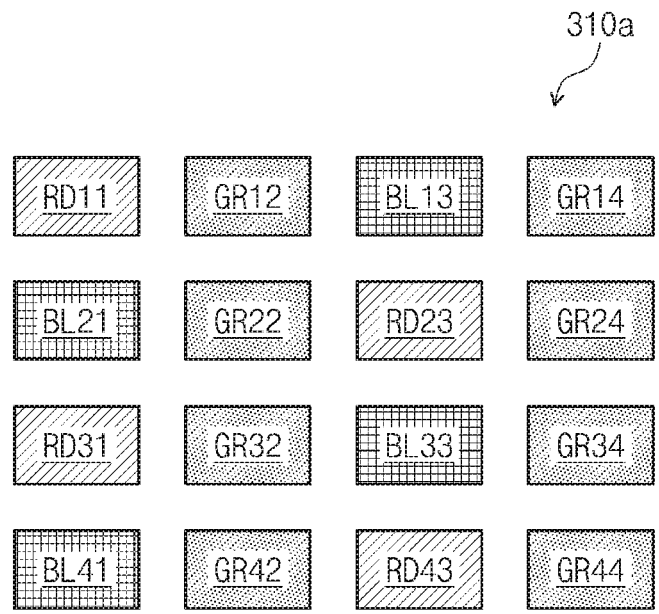
FIGS. 12A to 12D are diagrams illustrating arrangement of pixels or arrangement of color filters, according to an embodiment of the inventive concepts.

Referring to FIG. 12A, a pixel array 310a may include a plurality of pixels. Each of the pixels may have the corresponding pixel color and may be disposed as illustrated in FIG. 12A. For example, in a first row of the pixel array 310a, pixels may be arranged in an order of RD11, GR12, BL13, and GR14; in a second row, pixels may be arranged in an order of BL21, GR22, RD23, and GR24. Likewise, in third and fourth rows, pixels may be arranged as illustrated in FIG. 12A. In an embodiment, the pixel array 310a described with reference to FIG. 12A may include arrangement of a pentile structure. However, embodiments of the inventive concepts may not be limited thereto.

Figure 12B:
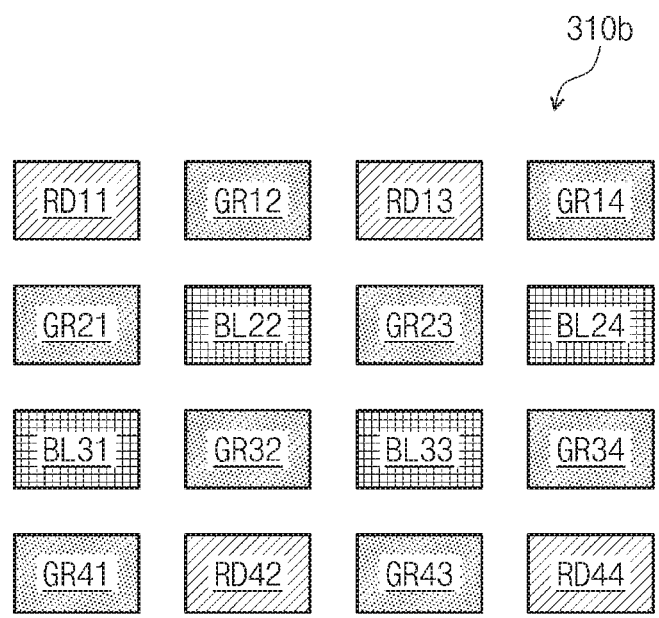

Referring to FIG. 12B, a pixel array 310b may include a plurality of pixels. Each of the pixels may have the corresponding pixel color and may be disposed as illustrated in FIG. 12B. In an embodiment, according to the pixel array 310b illustrated in FIG. 12B, power consumption may be reduced even though gate lines and switch signals are sequentially provided. For example, as described with reference to FIG. 4A, in the case where a switch circuit is a 1:2 demultiplexer and gate lines and switch signals are sequentially provided, according to the pixel array 310b illustrated in FIG. 12B, pixels may be activated in an order of RD11→GR12→GR21→BL22→BL31→GR32→GR41→RD42. In this case, since pixels having the same pixel color are activated adjacent to each other, power consumed to charge a cap (in particular, a driving cap $C_A$) on a display panel may be reduced, and power consumption due to a change in a gamma voltage may be also reduced.

Figure 12C:
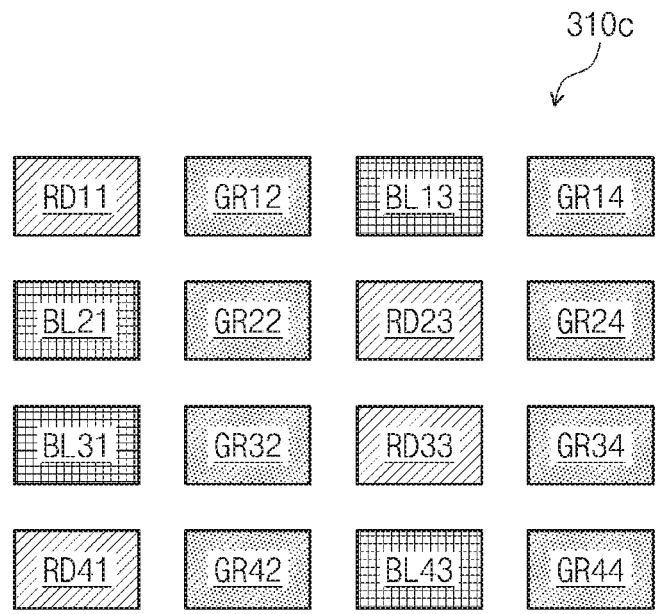

Referring to FIG. 12C, a pixel array 310c may include a plurality of pixels. Each of the pixels may have the corresponding pixel color and may be disposed as illustrated in FIG. 12C. In an embodiment, according to the pixel array 310c illustrated in FIG. 12C, as described with reference to FIG. 6A, power consumption may be reduced even though gate lines are sequentially activated and switch signals are non-sequentially provided. For example, as described with reference to FIG. 6A, in the case where a switch circuit is a 1:2 demultiplexer, gate lines are sequentially activated, and switch signals are non-sequentially provided, pixels may be activated in an order of RD11→GR12→GR22→BL21→BL31→GR32→GR42→RD41. In this case, since pixels that are connected with the same data line and have the same pixel color are activated adjacent to each other, power consumed to charge caps (in particular, a driving cap $C_A$ and a line cap $C_B$) on a display panel may be reduced, and power consumption due to a change in a gamma voltage may be also reduced.

Figure 12D:
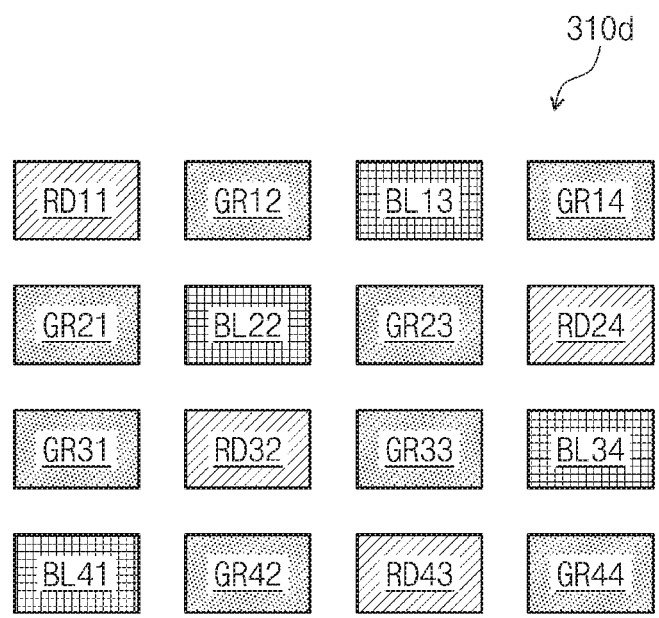

Referring to FIG. 12D, a pixel array 310d may include a plurality of pixels. Each of the pixels may have the corresponding pixel color and may be disposed as illustrated in FIG. 12C. In an embodiment, according to the pixel array 310d illustrated in FIG. 12D, as described with reference to FIG. 5, power consumption may be reduced even though gate lines are non-sequentially activated and switch signals are sequentially provided. For example, as described with reference to FIG. 5A, in the case where a switch circuit is a 1:2 demultiplexer, gate lines are non-sequentially activated, and switch signals are sequentially provided, pixels may be activated in an order of RD11→GR12→GR21→BL22→BL41→GR42→GR31→RD32. In this case, since pixels having the same pixel color are activated adjacent to each other, power consumed to charge a cap (in particular, a driving cap $C_A$) on a display panel may be reduced, and power consumption due to a change in a gamma voltage may be also reduced.

That is, as described above, it may be well understood that the scope and spirit of the inventive concepts is implemented through various pixel arrangements as well as the pixel arrangement of the pentile structure. In an embodiment, in the case where a display device is implemented with an LCD device, the pixel arrangements illustrated in FIGS. 12A to 12D may indicate a color filter array (CFA).

Figure 13:
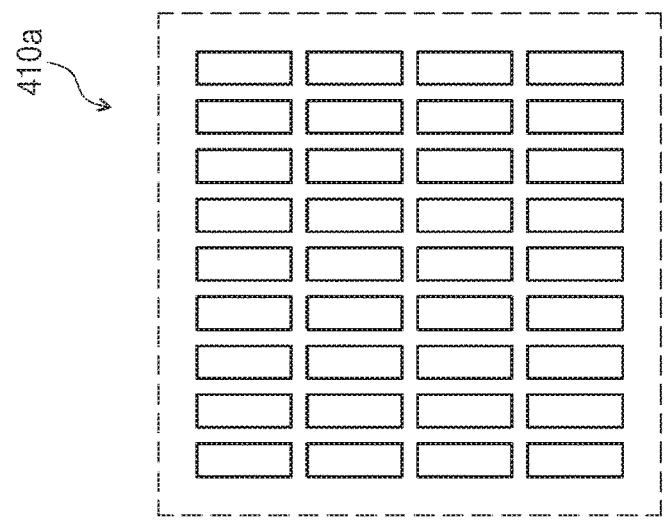
FIG. 13 is a diagram illustrating structures of various pixel arrays according to an embodiment of the inventive concepts.
Figure 13:
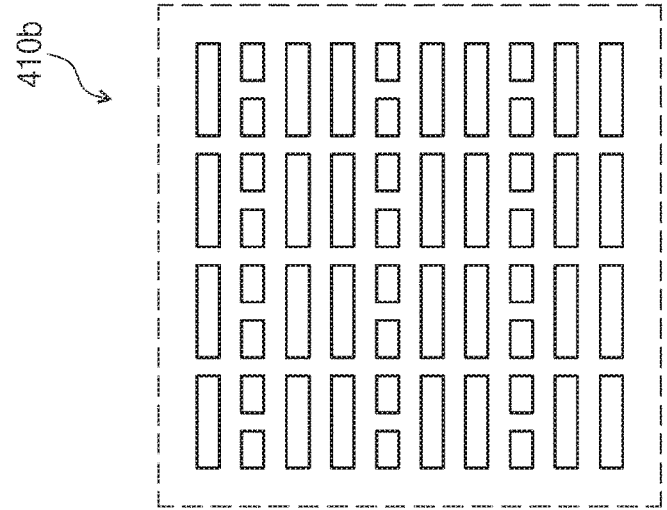
Figure 13:
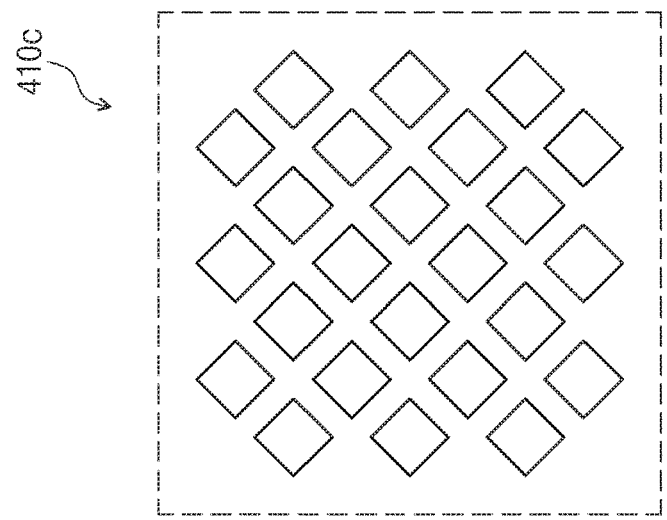

FIG. 13 is a diagram illustrating structures of various pixel arrays according to an embodiment of the inventive concepts. Referring to FIG. 13, a pixel array according to an embodiment of the inventive concepts may be implemented with various shapes of pixel arrangements. For example, the pixel array according to an embodiment of the inventive concepts may include pixels that are arranged in a pentile structure as described with reference to FIGS. 1 to 12.

Also, a pixel array 410a may include pixels arranged in a stripe structure. Alternatively, a pixel array 410b may include pixels arranged in an S-stripe structure. Alternatively, a pixel array 410c may include pixels arranged in a delta structure or a diamond structure. That is, a structure of a pixel array according to an embodiment of the inventive concepts may not be limited to a specific structure and may be modified or changed to have various pixel arrangements or structures.

Figure 14:
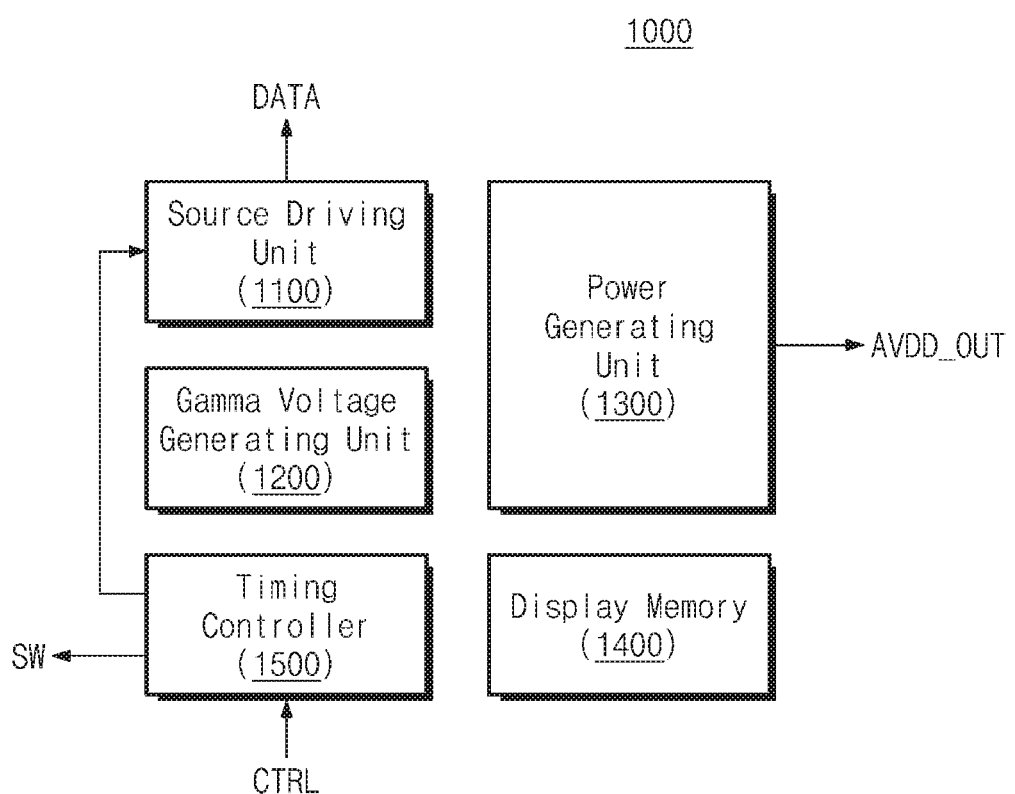
FIG. 14 is a block diagram illustrating a source driver according to an embodiment of the inventive concepts.

FIG. 14 is a block diagram illustrating a source driver according to an embodiment of the inventive concepts. Referring to FIG. 14, a source driver 1000 (called a "display driving integrated circuit (DDI)") may include a source driving unit 1100, a gamma voltage generating unit 1200, a power generating unit 1300, a display memory 1400, and a timing controller 1500.

The source driving unit 1100 may be configured to generate data signals to be provided to a plurality of pixels. The gamma voltage generating unit 1200 may be configured to generate gamma voltages for the source driving unit 1100 to generate the data signals. The power generating unit 1300 may be configured to generate power AVDD_OUT used in the source driver 1000 (or a display device in which a source driver is included). The display memory 1400 may be configured to store image information received from the outside (e.g., a central processing unit (CPU), a graphics processing unit (GPU), or a graphics controller). The timing controller 1500 may be configured to control overall operations of the source driver 1000 in response to a control signal CTRL from the outside. The control signal CTRL may include a vertical synchronization signal Vsync, a horizontal synchronization signal Hsync, a data enable signal, and clock signals. The timing controller 1500 may control operations of the source driving unit 1100, a gate driver (not illustrated), and a switch driver (not illustrated) in synchronization with the control signal CTRL. In an embodiment, the timing controller 1500 may be configured to output switch signals SW for controlling the above-described switch driver.

According to the above-described embodiments of the inventive concepts, a display device may activate a gate line connected with a pixel having the same pixel color as the last active pixel and may activate switch signals such that a data signal is first provided to a pixel having the same pixel color as the last active pixel. In an embodiment, an order in which gate lines are activated and an order which switch signals are activated may be determined by the source driver 1000 or the timing controller 1500 of the source driver 1000. The source driver 1000 may be configured to output a data signal to an active pixel based on an order in which gate lines are activated and an order which switch signals are activated.

Figure 15:
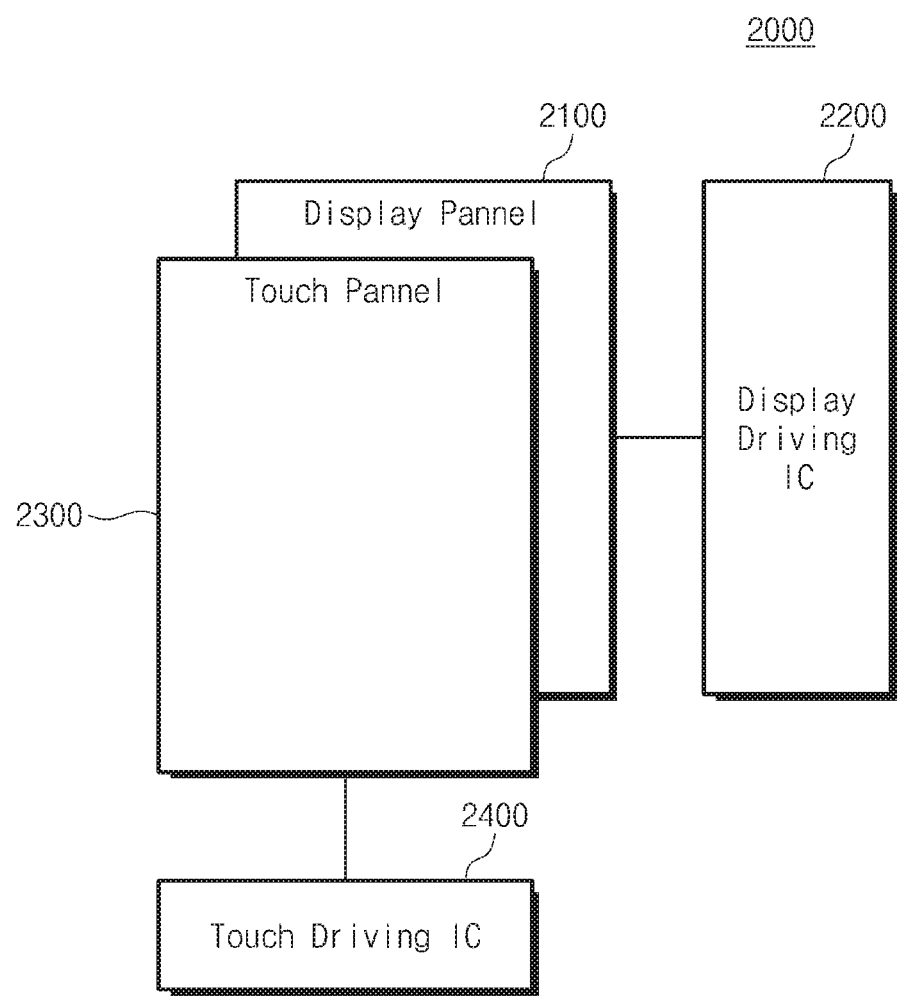
FIG. 15 is a block diagram illustrating a touch display device to which the display device according to an embodiment of the inventive concepts is applied.

FIG. 15 is a block diagram illustrating a touch display device to which a display device according to an embodiment of the inventive concepts is applied. Referring to FIG. 15, a touch display device 2000 may include a display panel 2100, a display driving integrated circuit (DDI) 2200, a touch panel 2300, and a touch driving integrated circuit (TDI) 2400.

The display panel 2100 may include a pixel array described with reference to FIGS. 1 to 14. Alternatively, the display panel 2100 may include a pixel array, a gate driver, or a switch driver described with reference to FIGS. 1 to 14.

The DDI 2200 may display image information through a plurality of pixels by controlling a plurality of pixels included in the display panel 2100. In an embodiment, the DDI 2200 may be a source driver described with reference to FIGS. 1 to 14. In an embodiment, the display panel 2100 and the DDI 2200 may display image information based on the operating method described with reference to FIGS. 1 to 14.

The touch panel 2300 includes a plurality of touch electrodes for sensing a user touch. The TDI 2400 may be configured to sense a user touch by sensing a signal change or a capacitance change on the plurality of touch electrodes.

In an embodiment, the touch panel 2300 may be implemented in an out-cell or on-cell type in which the touch panel 2300 is formed on the display panel 2100. Alternatively the display panel 2100 and the touch panel 2300 may be formed on the same semiconductor substrate (a so-called in-cell type). In an embodiment, the DDI 2200 and the TDI 2400 may be implemented with one integrated circuit (i.e., a touch and display driving IC (TDDIC)) to drive the display panel 2100 and the touch panel 2300.

As described above, a display device according to an embodiment of the inventive concepts may non-sequentially activate gate lines and switch signals. In this case, the display device may activate the gate lines such that there is activated a gate line connected to a pixel that is connected to the same data line as the last active pixel and has the same pixel color as the last active pixel. Also, the display device may activate switch signals such that a data signal is first provided to a pixel having the same pixel color as the last active pixel. As such, power consumed to charge a cap on a display panel and power consumption due to a change in a gamma voltage may be reduced. Accordingly, a display device capable of reducing power consumption and an operating method thereof may be provided.

The above-mentioned description refers to embodiments for implementing the scope of the inventive concepts. Embodiments in which a design is changed simply or which are easily changed may be included in the scope of the inventive concepts as well as an embodiment described above. In addition, technologies that are easily changed and implemented by using the above-mentioned embodiments may be also included in the scope of the inventive concepts. Therefore, it should be understood that the above embodiments are not limiting, but illustrative.

According to an embodiment of the inventive concepts, a display device may non-sequentially activate gate lines and switch signals. As such, power consumed to charge/discharge a capacitor in a display panel and power consumption due to a change in a gamma voltage may be reduced. Accordingly, a display panel with reduced power consumption, a display device, and an operating method of the display device may be provided.

While the inventive concepts has been described with reference to embodiments, it will be apparent to those skilled in the art that various changes and modifications may be made without departing from the spirit and scope of the inventive concepts. Therefore, it should be understood that the above embodiments are not limiting, but illustrative.

What is claimed is:

1. A control integrated circuit for a display panel including an array of pixels, each row of the array associated with a respective gate line of a plurality of gate lines and each column of the array associated with a respective data line of a plurality of data lines, comprising:
  a gate driver configured to selectively drive the plurality of gate lines;
  a source driver configured to supply data to the display panel; and
  a controller configured to generate switch control signals for controlling a switch driver of the display panel,
    wherein the switch driver includes a plurality of switch circuits, each of the plurality of switch circuits connected to at least three of the plurality of data lines and configured to select one of the at least three of the plurality of data lines in response to the switch control signals, the switch driver configured to non-sequentially activate the plurality of switch circuits in active periods to the plurality of gate lines,
  the switch driver for selectively supplying the data to the plurality of data lines, and the controller configured to control the gate driver and generate the switch control signals such that
    the plurality of gate lines are activated non-sequentially, and same color pixels connected with the same data line are activated in a sequence,
wherein colors of at least two pixels connected to the one of the plurality of data lines are different from each other.

2. The control integrated circuit of claim 1, wherein the controller is configured to control the gate driver and generate the switch control signals such that the plurality of data lines are activated in a same order each time one of the plurality of gate lines is activated.

3. The control integrated circuit of claim 2, wherein the controller is configured to generate first to third switch control signals.

4. The control integrated circuit of claim 3, wherein the display panel includes a first gate line, a second gate line, a third gate line a fourth gate line, a fifth gate line, and a sixth gate line disposed consecutively, and wherein
the controller is configured to control the gate driver such that the gate driver activates the first gate line, the third gate line, the second gate line, the fourth gate line, the sixth gate line, and the fifth gate line in sequence.

5. The control integrated circuit of claim 1, wherein the display panel includes a first gate line, a second gate line, a third gate line, fourth gate, a fifth gate line, and a sixth gate line disposed consecutively, and wherein
the controller is configured to control the gate driver such that the gate driver activates the first gate line, the third gate line, the second gate line, the fourth gate line, the sixth gate line and the fifth gate line in sequence.

6. A control integrated circuit for a display panel including an array of pixels, each row of the array associated with a respective gate line of a plurality of gate lines and each column of the array associated with a respective data line of a plurality of data lines, comprising:
a gate driver configured to selectively drive the plurality of gate lines;
a source driver configured to supply data to the display panel; and
a controller configured to generate switch control signals for controlling a switch driver of the display panel, the switch driver for selectively supplying the data to the plurality of data lines, and the switch driver including a plurality of switch circuits, each of the plurality of switch circuits connected to at least three of the plurality of data lines and configured to select one of the at least three of the plurality of data lines in response to the switch control signals, the switch driver configured to non-sequentially activate the plurality of switch circuits in active periods to the plurality of gate lines, and wherein the plurality of gate lines are activated non-sequentially,
the controller configured to control the gate driver and generate the switch control signals such that
the plurality of data lines are activated in a first order for a currently activated gate line of the plurality of gate lines, and are activated in a second order for a subsequently activated gate line of the plurality of gate lines, the second order being different from the first order, and
an order of pixels activated and associated with a same one of the plurality of data lines includes at least two pixels of a same color activated in sequence.

7. The control integrated circuit of claim 6, wherein the at least two pixels are consecutively activated.

8. The control integrated circuit of claim 6, wherein the controller is configured to generate the switch control signals such that after a first data line is activated more than one time, the first data line is not activated again until a second data line is activated more than one time.

9. A display device, comprising:
a display panel including an array of pixels, each row of the array associated with a respective gate line of a plurality of gate lines and each column of the array associated with a respective data line of a plurality of data lines;
a switch driver for selectively supplying data to the plurality of data lines,
wherein the switch driver includes a plurality of switch circuits, each of the plurality of switch circuits connected to at least three of the plurality of data lines and configured to select one of the at least three of the plurality of data lines in response to switch control signals, the switch driver configured to non-sequentially activate the plurality of switch circuits in active periods to the plurality of gate lines; and
a control integrated circuit configured to selectively drive the plurality of gate lines, configured to supply data to the display panel, configured to generate switch control signals for controlling the switch driver, and configured to selectively drive the plurality of gate lines and generate the switch control signals such that
the plurality of gate lines are activated non-sequentially, and
an order of pixels activated and associated with a same one of the plurality of data lines includes at least two pixels of a same color activated in sequence
wherein colors of at least two pixels connected to the one of the plurality of data lines are different from each other.

10. The display device of claim 9, wherein the display panel is an OLED display panel.

11. The display device of claim 9, wherein the array of pixels is a pentile array.

12. The display device of claim 9, wherein one row of pixels in the array includes red, green, blue and green pixels sequentially ordered, and a subsequent row of pixels in the array includes green, blue, green and red pixels sequentially ordered.

13. The display device of claim 9, wherein one row of pixels in the array includes red, green, blue and green pixels sequentially ordered, and a subsequent row of pixels in the array includes blue, green, red, green pixels sequentially ordered.

14. The display device of claim 9, wherein the array has a stripe pixel structure.

15. The display device of claim 9, wherein the array has an S-stripe pixel structure.

16. The display device of claim 9, wherein the array has a delta pixel structure.

17. The display device of claim 9, wherein
the control integrated circuit is configured to selectively drive the plurality of gate lines and generate the switch control signals such that the plurality of data lines are activated in a same order each time one of the plurality of gate lines is activated.

18. The display device of claim 17, wherein
the control integrated circuit is configured to generate first to third switch control signals.

* * * * *